US010509525B2

(12) United States Patent
Nakajima et al.

(10) Patent No.: US 10,509,525 B2
(45) Date of Patent: Dec. 17, 2019

(54) TOUCH PANEL

(71) Applicant: Mitsubishi Electric Corporation, Tokyo (JP)

(72) Inventors: Yoshinori Nakajima, Tokyo (JP); Yoshiaki Koizumi, Tokyo (JP); Soichiro Kurokawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/097,944

(22) PCT Filed: Aug. 2, 2016

(86) PCT No.: PCT/JP2016/072692
§ 371 (c)(1),
(2) Date: Oct. 31, 2018

(87) PCT Pub. No.: WO2018/025334
PCT Pub. Date: Feb. 8, 2018

(65) Prior Publication Data
US 2019/0155423 A1 May 23, 2019

(51) Int. Cl.
*G06F 3/045* (2006.01)
*G06F 3/02* (2006.01)
*G06F 3/041* (2006.01)

(52) U.S. Cl.
CPC ................ *G06F 3/045* (2013.01); *G06F 3/02* (2013.01); *G06F 3/041* (2013.01)

(58) Field of Classification Search
CPC . G06F 3/045; G06F 3/02; G06F 3/041; E03C 1/055
See application file for complete search history.

(56) References Cited

U.S. PATENT DOCUMENTS

| | | | |
|---|---|---|---|
| 5,924,555 | A | 7/1999 | Sadamori et al. |
| 2012/0182249 | A1 | 7/2012 | Endo et al. |
| 2016/0357316 | A1 | 12/2016 | Koizumi |

FOREIGN PATENT DOCUMENTS

| | | | |
|---|---|---|---|
| JP | H10-188728 | A | 7/1998 |
| JP | 2012-221006 | A | 11/2012 |

(Continued)

OTHER PUBLICATIONS

International Search Report of the International Searching Authority dated Sep. 6, 2016 for the corresponding International application No. PCT/JP2016/072692 (and English translation).

(Continued)

*Primary Examiner* — Sardis F Azongha
(74) *Attorney, Agent, or Firm* — Posz Law Group, PLC

(57) ABSTRACT

A touch panel includes a first sheet and a second sheet that are disposed opposing each other. A first conductive path and a second conductive path are formed facing each other on main surfaces of the first sheet and the second sheet, respectively. The second conductive path is spaced apart from the first conductive path when viewed in the normal direction of the first sheet. On the main surface of the second sheet, pressure-detecting conductive paths electrically connected to the second conductive path are arranged. The pressure-detecting conductive paths intersect the first conductive path as viewed in the normal direction. Structures are disposed on a second sheet main surface not opposing the first sheet, and cause flexing of the corresponding pressure-detecting conductive path to contact the first conductive path when pressed down.

2 Claims, 20 Drawing Sheets

(56) References Cited

FOREIGN PATENT DOCUMENTS

| | | | |
|---|---|---|---|
| JP | 2015-011584 | A | 1/2015 |
| JP | 2015-153482 | A | 8/2015 |
| WO | 2015/140928 | A1 | 9/2015 |
| WO | 2015/141058 | A1 | 9/2015 |

OTHER PUBLICATIONS

Extended European Search Report dated Jul. 31, 2019 issued in corresponding EP patent application No. 16911595.3.

| | | SCREEN ID | | | |
|---|---|---|---|---|---|
| | | SCREEN 1 | SCREEN 2 | · · · | SCREEN N |
| STRUCTURE | STRUCTURE a | CONTROL A1 | CONTROL A2 | · · · | CONTROL AN |
| | STRUCTURE b | CONTROL B1 | CONTROL B2 | · · · | CONTROL BN |
| | STRUCTURE c | CONTROL C1 | CONTROL C2 | · · · | CONTROL CN |
| | ⋮ | ⋮ | ⋮ | · · · | ⋮ |
| | STRUCTURE h | CONTROL H1 | CONTROL H2 | · · · | CONTROL HN |
| | STRUCTURE i | CONTROL I1 | CONTROL I2 | · · · | CONTROL IN |

TOUCH PANEL

CROSS REFERENCE TO RELATED APPLICATION

This application is a U.S. national stage application of PCT/JP2016/072692 filed on Aug. 2, 2016, the contents of which are incorporated herein by reference.

TECHNICAL FIELD

The present disclosure relates to a touch panel.

BACKGROUND ART

Touch panels are commonly used as input devices for various types of equipment such as home electric appliances and portable terminals. Patent Literature 1, for example, discloses a resistive touch panel including transparent electrode substrates having transparent conductive films of indium tin oxide (ITO) or the like, with the transparent electrode substrates vertically opposing each other via a gap therebetween and fixed at outer frame portions thereof. As disclosed in Patent Literature 1, pressing-down positions on such a resistive touch panel, for example of a four-wire type, are detected with two parallel wires disposed on each of upper and lower substrates to alternately form a potential distribution in an X direction in one of the substrates and a potential distribution in a Y direction in the other of the substrates so that application of the potential distribution and detection of the electric potential are alternately performed on each of the upper and lower substrates. Further, a touch panel is disclosed in Patent Literature 2 in which a first sheet and a second sheet are disposed opposing each other with a gap therebetween. For the touch panel described in Patent Literature 2, the pressing-down position is detected by a simple structure in which a first conductive path is arranged on the first sheet, for example, and a second conductive path and a pressure-detecting conductive path are arranged on the second sheet.

CITATION LIST

Patent Literature

Patent Literature 1: Unexamined Japanese Patent Application Kokai Publication No. 2012-221006

Patent Literature 2: International Publication No. WO2015/140928

SUMMARY OF INVENTION

Technical Problem

In the touch panel described in Patent Literature 1, a transparent conductive film (ITO) is provided for each of the upper and lower transparent electrode substrates, and two parallel wires are further provided for each of the upper and lower transparent electrode substrates. Thus configuration of the touch panel is complex.

Further, in the touch panel described in Patent Literature 1, a potential distribution is alternatingly formed in the parallel wires of the upper and lower substrates to detect the depression position. Thus the structure for detecting the depression position often becomes complex.

When using the touch panel described in Patent Literature 2, the pressing-down position is detected by causing contact between a portion of the conductive paths, such as contact between the first conductive path and the pressure-detecting conductive path. Thus the configuration of the touch panel described in Patent Literature 2 is not as complex as that of the touch panel described in Patent Literature 1, and cost of mass production is reduced. However, as described below, the touch panel described in Patent Literature 2 has a problem in that, in accordance with circumstances such as stiffness or strength of the first and second sheets and bending during pressing, the touch panel basically reacts to pressing only in the vicinity of the conductive path, thereby preventing arrangement of a switch range (range in which pressing causes reaction of a switch) of freely-selected size.

The below described results were obtained when a prototype of the touch panel described in Patent Literature 2 was produced and tested. Specifically, in the case of the touch panel described in Patent Literature 2, sometimes the switch did not react even when a location was pressed that was at least 5 mm separated from the conductive path (first conductive path, second conductive path, pressure-detecting conductive path, or pressure-detecting supplementary conductive path). That is, although there is lot-to-lot variance, the touch panel described in Patent Literature 2 is limited to a switch range of about 5 mm. The switch range of the touch panel of a typical home electric appliance or remote controller is about 10 mm, and thus the switch range of the touch panel described in Patent Literature 2 is understood to be narrower than a typical switch range.

In consideration of the aforementioned circumstances, an objective of the present disclosure is to provide a touch panel capable of expanding the switching range in which the switch reacts due to pressing, and capable of detecting the pressed switch range by a simple configuration.

Solution to Problem

In order to achieve the aforementioned objective, a touch panel according to the present disclosure includes:

- a first sheet;
- a second sheet, the first sheet and the second sheet opposing each other with a gap therebetween;
- a main conductive path formed on an inner surface of the first sheet;
- a supplementary conductive path formed on an inner surface of the second sheet and overlapping the main conductive path as viewed in a normal direction of the first sheet; and
- a structure disposed on an outer surface of the second sheet and configured to cause flexing of the supplementary conductive path to cause the supplementary conductive path to contact the main conductive path when the structure is pressed down.

Advantageous Effects of Invention

According to the present disclosure, the main conductive path is arranged on the inner surface of the first sheet, a supplementary conductive path is arranged on the inner surface of the second sheet, and a structure is arranged on the outer surface of the second sheet, and thus the configuration of the touch panel can be simplified. Further, switch range can be expanded appropriately due to capability of electrical contact with the main conductive path of the first sheet by flexing of the supplementary conductive path of the second sheet due to, when any portion of the structures is pressed, application of uniform force from the structure that is hard or stiff, for example.

BRIEF DESCRIPTION OF DRAWINGS

FIG. 6 is a drawing illustrating an example of control content data according to Embodiment 1;

DESCRIPTION OF EMBODIMENTS

Figure 1:
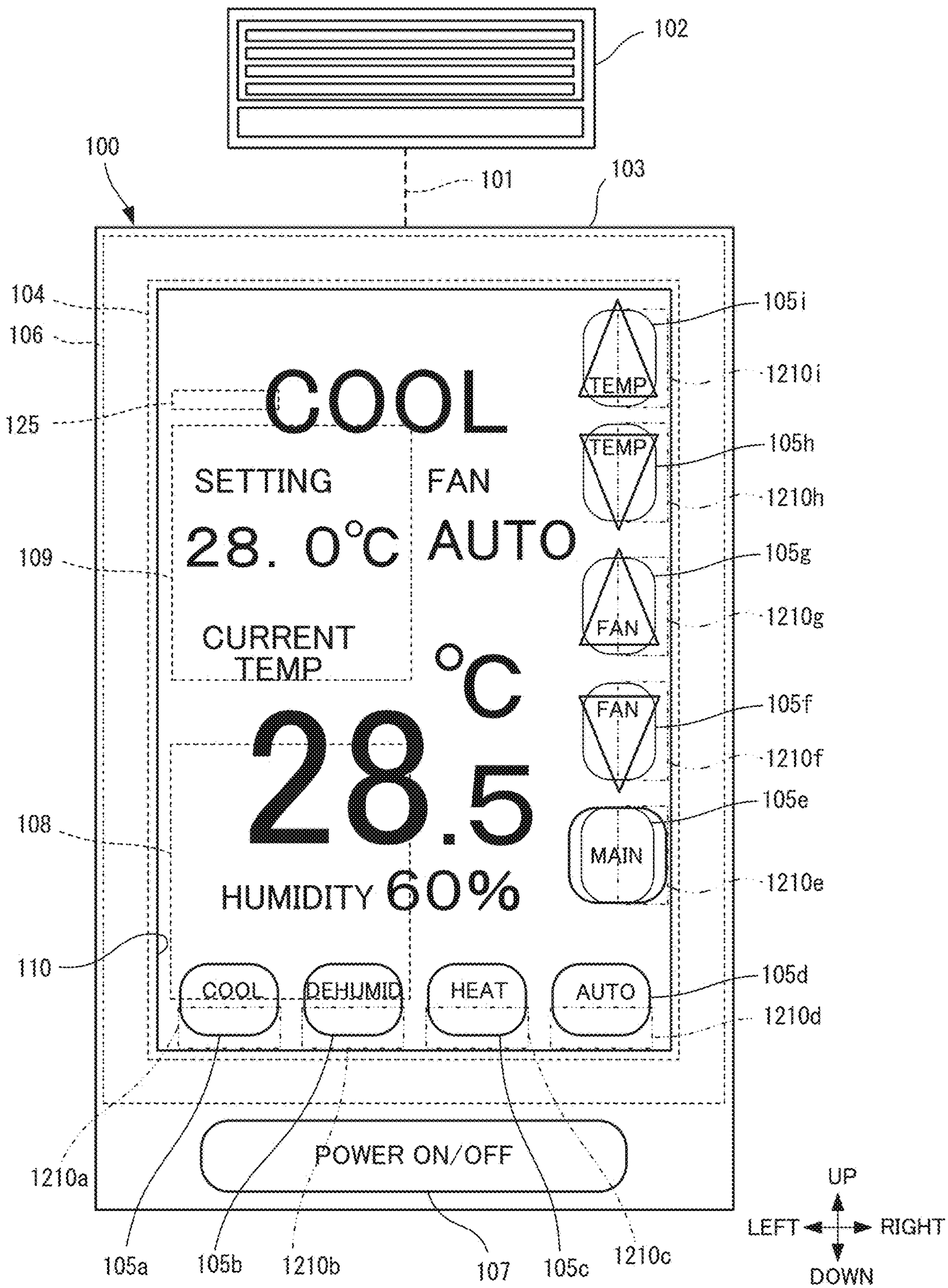
FIG. 1 is a front view of a remote controller according to Embodiment 1 of the present disclosure.

Embodiments of the present disclosure are described below in detail with reference to drawings. Throughout the drawings, components that are the same or equivalent are assigned the same reference signs. In the drawings, fine dashed lines indicate hidden lines, and fine double-dot-dashed lines indicate virtual lines.

Embodiment 1

A remote controller 100 according to Embodiment 1 of the present disclosure is a device that controls an air conditioner 102 by communication with the air conditioner 102 via a communication line 101 as shown in the front view illustrated in FIG. 1. The communication line 101 may be wireless, wired, or a combination of such, and may use a freely-selected communication protocol.

As illustrated in FIG. 1, the remote controller 100 includes: a cover 103 that accommodates therein various types of components, a display 104 for forward display of an image, a touch panel 106 that includes structures **105*a* to 105*i* that are depressed by a user, a power supply button 107 for ON-OFF switching of the air conditioner 102, a power supply 108 that supplies power for operating the remote controller 100, and a microcomputer 109 that controls operation of the remote controller 100. Further, although the structures 105*a* to 105*i*** are typically pressed by a finger of the user, a pen-shaped tool may be used for pressing.

Here, the "forward direction" is taken to be the forward direction out of the plane of the paper of FIG. 1, and the "rearward direction" is taken to be toward the back of the plane of the paper.

The cover 103 in a forward direction portion thereof has an approximately rectangular-shaped opening 110. The image of the display 104 is presented in the forward direction through the opening 110 that undergoes the operation performed on the touch panel 106 by the user.

The display 104 has a screen that displays the image and a flame at the circumference of the screen. As illustrated in FIG. 1, the screen of the display 104 is typically rectangular, and is disposed to be aligned with the opening 110 of the cover 103. The display 104, for example, is a full-dot color liquid crystal display panel and includes components such as a liquid crystal panel, a drive circuit for driving the liquid crystal panel, a color filter, and a light source. A freely-selected display panel may be used for the display 104, and examples of the display panel include a monochrome liquid crystal display panel and a segmented-type liquid crystal display panel The structures 105*a* to 105*i* are used to enable operation of the touch panel 106 in wider ranges than minimum pressure-sensitive regions 1210*a* to 1210*i*. The "minimum pressure-sensitive regions 1210*a* to 1210*i*" are ranges that are capable of pressure-sensitive reaction in the case of omission of the structures 105*a* to 105*i*, and are narrower than the switch range (range in which the switch responds to pressing) to be achieved by the touch panel 106. Thus the structures 105*a* to 105*i* are disposed on the surface of the touch panel 106, and as described below, the switch range is widened to the size of the structures 105*a* to 105*i* that are wider than the minimum pressure-sensitive regions 1210*a* to 1210*i*.

The structures 105*a* to 105*i*, for example, are transparent thin members (pads) and are formed from a material that is harder or stiffer than either a below-described first sheet 111 or a below-described second sheet 112 of the touch panel 106. Thus upon application of a force to the structure 105*a* by an action such as touching or pressing, the structure 105*a* can uniformly sink downward and transmit the pressing to the minimum pressure-sensitive region 1210*a*. That is, in comparison to the case in which the minimum pressure-sensitive regions 1210*a* to 1210*i* are directly pressed, by causing pressing via the structures 105*a* to 105*i*, the range in which detection of pressing is enabled can expand to the switch range that is to be achieved. Thus the operation performed on the touch panel 106 can be appropriately detected.

The touch panel 106 is a sheet-like component arranged forward of the screen of the display 104. As illustrated in FIG. 1, images displayed by the display 104 are shown at positions that overlap the structures 105*a* to 105*i*, and the images indicate processing that is executed when the respective structures 105*a* to 105*i* are depressed. Such configuration enables intuitive operation by the user.

Figure 2:
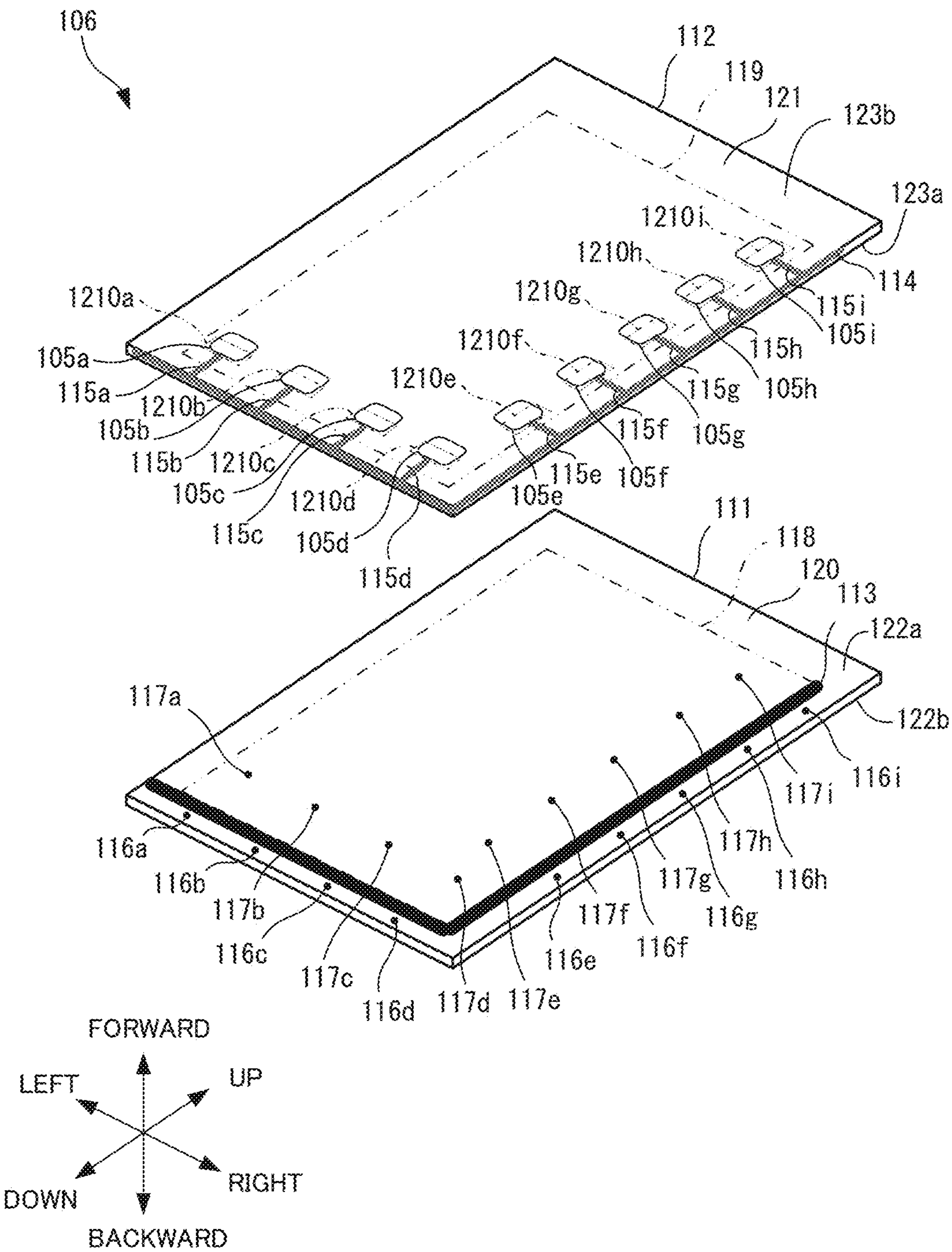
FIG. 2 is an exploded perspective view of the touch panel according to Embodiment 1.

In particular, as illustrated in the exploded perspective view of FIG. 2, the touch panel 106 includes: the first sheet 111 and the second sheet 112 disposed opposing each other with a gap therebetween, a first conductive path 113 formed on the first sheet 111, a second conductive path 114 formed on the second sheet 112, pressure-detecting conductive paths 115*a* to 115*i* for detection of whether any of the structures 105*a* to 105*i* are depressed, and spacers 116*a* to 116*i* and 117*a* to 117*i* arranged between the first sheet 111 and the second sheet 112 to maintain the gap therebetween.

Further, the first sheet 111 and the second sheet 112 are disposed opposing each other in the forward-rearward direction, and thus the normal direction of the first sheet 111 is the forward-rearward direction, and the normal direction of the second sheet 112 is aligned in the same direction. That is, the expression "as viewed from the front" in the description of the present embodiments corresponds to the expression "as viewed in the normal direction of the first sheet 111".

The first sheet 11 and the second sheet 112 are each made of a material such as polyethylene terephthalate (PET) resin, and are sheet-like components that are transparent and thin or are extremely thin. In the present embodiment, both the first sheet 111 and the second sheet 112 are rectangular shaped and have the same size as viewed from the front.

The first sheet 111 and the second sheet 112 include respective image transmission regions 118 and 119 previously determined as areas where the screen of the display 104 is positioned to be associated with the image transmission regions 118 and 119, and respective surrounding areas 120 and 121 outside the image transmission regions 118 and 119. In the present embodiment, the image transmission region 118 and the image transmission region 119 have the same size rectangular shape as viewed from the front direction.

More specifically, the first sheet 111 includes two main surfaces (a first main surface 122*a* and a third main surface 122*b*) that form the front and rear sides of the first sheet 111. In a similar manner, the second sheet 112 includes two main surfaces (a second main surface 123*a* and a fourth main surface 123*b*) that form the front and rear sides of the second sheet 112. The first sheet 111 and the second sheet 112 are disposed so as to oppose each other in the frontward-backward direction, and thus the first main surface 122*a* of the first sheet 111 becomes the inner surface opposing the second sheet 112, and the third main surface 122*b* becomes the outer surface that does not oppose the second sheet 112. In a similar manner, the second main surface 123*a* of the second sheet 112 becomes the inner surface opposing the first sheet 111, and the fourth main surface 123*b* becomes the outer surface that does not oppose the first sheet 111.

The first main surface 122*a* and the second main surface 123*a* are disposed to oppose each other so that the image transmission region 118 of the first sheet 111 and the image transmission region 119 of the second sheet 112 overlap each other in the frontward-backward direction. In the present embodiment, the screen of the display 104 is disposed rearward of the third main surface 122*b*. The image displayed on the display 104 is thus presented forward by transmission sequentially through the image transmission regions 118 and 119.

Further, as illustrated in FIG. 2, on the fourth main surface 123*b* (that is, the outer surface of the second sheet 112) as the front surface of the remote controller 100, the structures 105*a* to 105*i* are disposed within the image transmission region 119 and along the outer edge of the image transmission region 119. In the present embodiment, the structures 105*a* to 105*i* are arranged, as illustrated in the same drawing, in a row extending along the lower side and the right side of the image transmission region 119.

The first conductive path 113 is an electrically conductive portion formed on the first main surface 122*a* (that is, the inner surface of the first sheet 111) and extending continuously in linear or strip-like form. The first conductive path 113 in the present embodiment is a main conductive path of the first sheet 111 and is arranged on the outer edge of the image transmission region 118 of the first sheet 111. More specifically, the first conductive path 113 is provided on the lower side and the right side that make up a portion of the outer edge of the image transmission region 118.

The second conductive path 114 is an electrically conductive portion formed on the second main surface 123*a* (that is, the inner surface of the second sheet 112) and extending continuously in linear or strip-like form.

The second conductive path 114 in the present embodiment is a main conductive path of the second sheet 112 and is provided in the surrounding area 121 of the second main surface 123*a*, as illustrated in FIG. 2.

Figure 3:
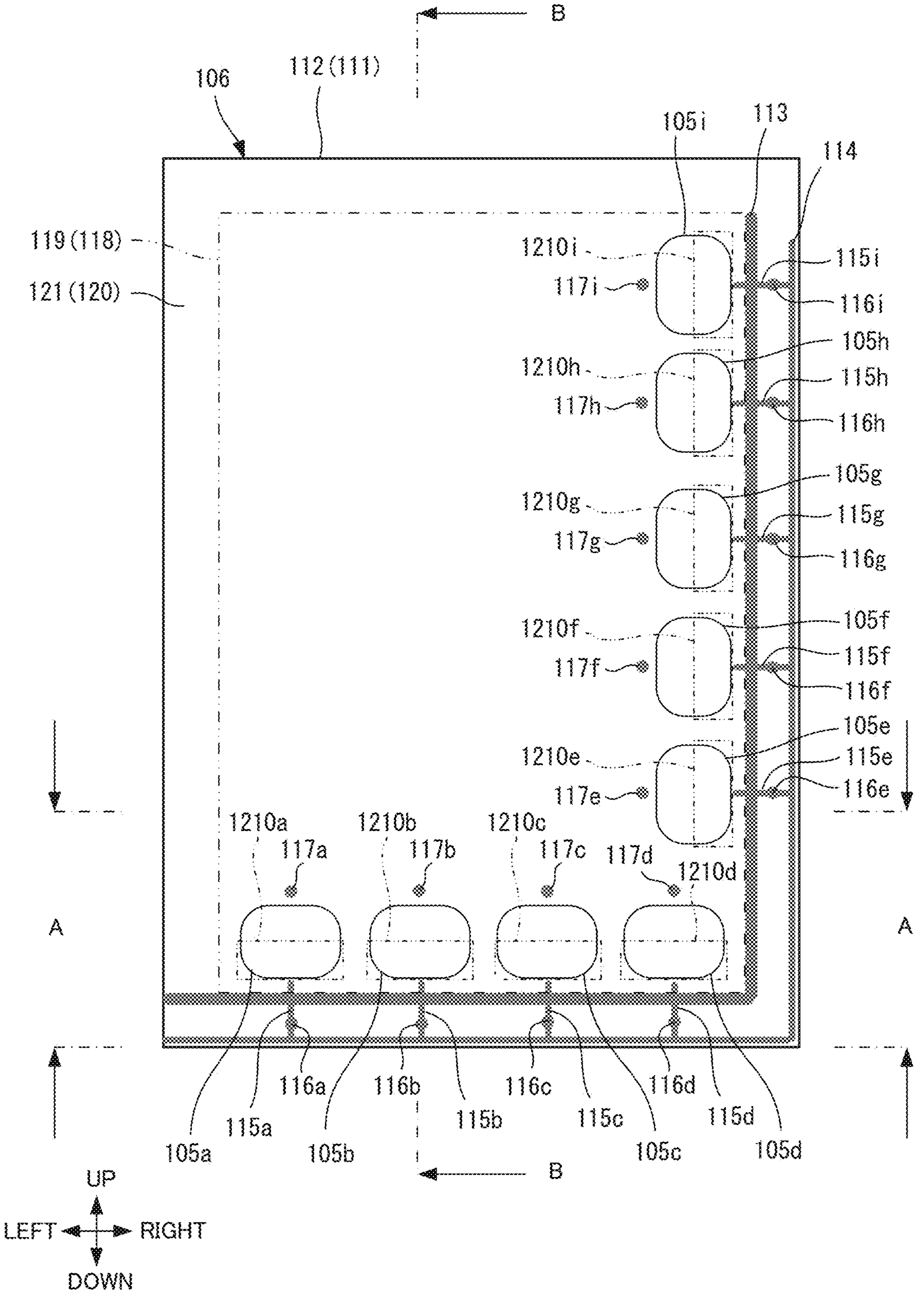
FIG. 3 is a front view of the touch panel according to Embodiment 1.

More specifically, as illustrated in FIG. 3, which is a front view of the touch panel 106, the second conductive path 114 is provided in a lower portion of the surrounding area 121, which is located below the image transmission region 119 and parallel to the lower side of the outer edge of the image transmission region 119, and is provided in a right portion of the surrounding area 121, which is located to the right of and parallel to the right side of the outer edge of the image transmission region 119. Thus, as viewed from the front direction, the second conductive path 114 is further spaced apart from the image transmission regions 118 and 119 than the first conductive path 113. Further, the first conductive path 113 and the second conductive path 114 are parallel to each other as viewed from the front direction.

Here, the first conductive path 113 and the second conductive path 114 being parallel to each other means that a distance between the first conductive path 113 and the second conductive path 114 is substantially constant in a direction perpendicular to the direction parallel to the outer edge of the image transmission regions 118 and 119 as viewed from the front.

The pressure-detecting conductive paths 115*a* to 115*i* are electrically conductive portions formed on the second main surface 123*a* (that is, the inner surface of the second sheet 112) in linear or strip-like form in order to detect which of the structures 105*a* to 105*i* is pressed. The pressure-detecting conductive paths 115*a* to 115*i* are supplementary conductive paths that are electrically connected to the main conductive path (second conductive path 114) of the second sheet 112. The pressure-detecting conductive paths 115*a* to 115*i* are arranged respectively in association with the structures 105*a* to 105*i*.

The pressure-detecting conductive paths 115*a* to 115*i* are, as illustrated in FIG. 3, provided along the lower side and the right side of the outer edge of the image transmission regions 118 and 119, and are parallel to each other with substantially equal spacing. The pressure-detecting conductive paths 115*a* to 115*i* are each electrically connected, at one end thereof, to the second conductive path 114 at different positions, and intersect the first conductive path 113 as viewed from the front.

The first conductive path 113, the second conductive path 114, and the pressure-detecting conductive paths 115*a* to 115*i* as described above are formed from conductive ink including a material such as silver or carbon. Printing of the conductive ink enables easy formation of the first conductive path 113, the second conductive path 114, and the pressure-detecting conductive paths 115*a* to 115*i*. Further, relatively low cost of the conductive ink enables a reduction in manufacturing costs.

The spacers 116*a* to 116*i* and 117*a* to 117*i* are provided between the first sheet 111 and the second sheet 112. Each of the spacers 116*a* to 116*i* and 117*a* to 117*i* is an extremely small transparent spherical particle that is made of a material such as resin.

The spacers 116*a* to 116*i* are disposed between the first conductive path 113 and the second conductive path 114 so that the spacers 116*a* to 116*i* and the corresponding pressure-detecting conductive paths 115*a* to 115*i* overlap, as viewed from the front as illustrated in FIG. 3. The spacers 116*a* to 116*i* can maintain the gap between the pressure-detecting conductive paths 115*a* to 115*i* and the first conductive path 113. This enables reliable prevention of the pressure-detecting conductive paths 115*a* to 115*i* from making electrical contact with the first conductive path 113 in a state in which none of the structures 105*a* to 105*i* are pressed.

The spacers 117*a* to 117*i* are disposed inside the image transmission regions 118 and 119 at positions located along lines extending from the corresponding pressure-detecting conductive path of the pressure-detecting conductive paths 115*a* to 115*i* as viewed from the front as illustrated in FIG. 3. The minimum pressure-sensing regions 1210*a* to 1210*i* are each defined between the region in which the corresponding spacers 117*a* to 117*i* are arranged and the first conductive path 113 as viewed from the front.

In the state in which none of the structures 105*a* to 105*i* are pressed, the spacers 117*a* to 117*i* can keep, in the minimum pressure-sensitive regions 1210*a* to 1210*i*, a gap between the second sheet 112 and the first sheet 111 opposing each other in the front-back direction. When any of the structures 105*a* to 105*i* is pressed, the gap narrows between the second sheet 112 and the first sheet 111 at the minimum pressure-sensitive region 1210*a* to 1210*i* corresponding to the pressed structure 105*a* to 105*i*. Thus the pressure-detecting conductive paths 115*a* to 115*i* corresponding to the pressed one of the structures 105*a* to 105*i* reliably flexes together with the second sheet 112, thereby enabling an electrical contact with the first conductive path 113, Such arrangement of the spacers 116*a* to 116*i* and 117*a* to 117*i* maintains the gap between the first sheet 111 and the second sheet 112 in the state in which the structures 105*a* to 105*i* are not pressed. The length of the gap in the front-back direction is set such that, when any of the structures 105*a* to 105*i* is pressed so that the second sheet 112 flexes, the pressure-detecting conductive path 115*a* to 115*i* corresponding to the pressed structure 105*a* to 105*i* contacts the first conductive path 113.

The power supply button 107 is a button arranged below the opening 110 in the front portion of the cover 103, as illustrated in FIG. 1. When the user depresses the power supply button 107, the air conditioner 102 is turned ON or OFF under control of the microcomputer 109.

Here, the "turning ON" of the air conditioner 102 denotes a state (operation state) in which the air conditioner 102 operates to condition the air within a target space. The "turning OFF" of the air conditioner 102 denotes a state (standby state) in which the air conditioner 102 waits for an instruction to start operation, that is, an instruction output by the microcomputer 109 upon the pressing down of the power supply button 107.

Figure 4:
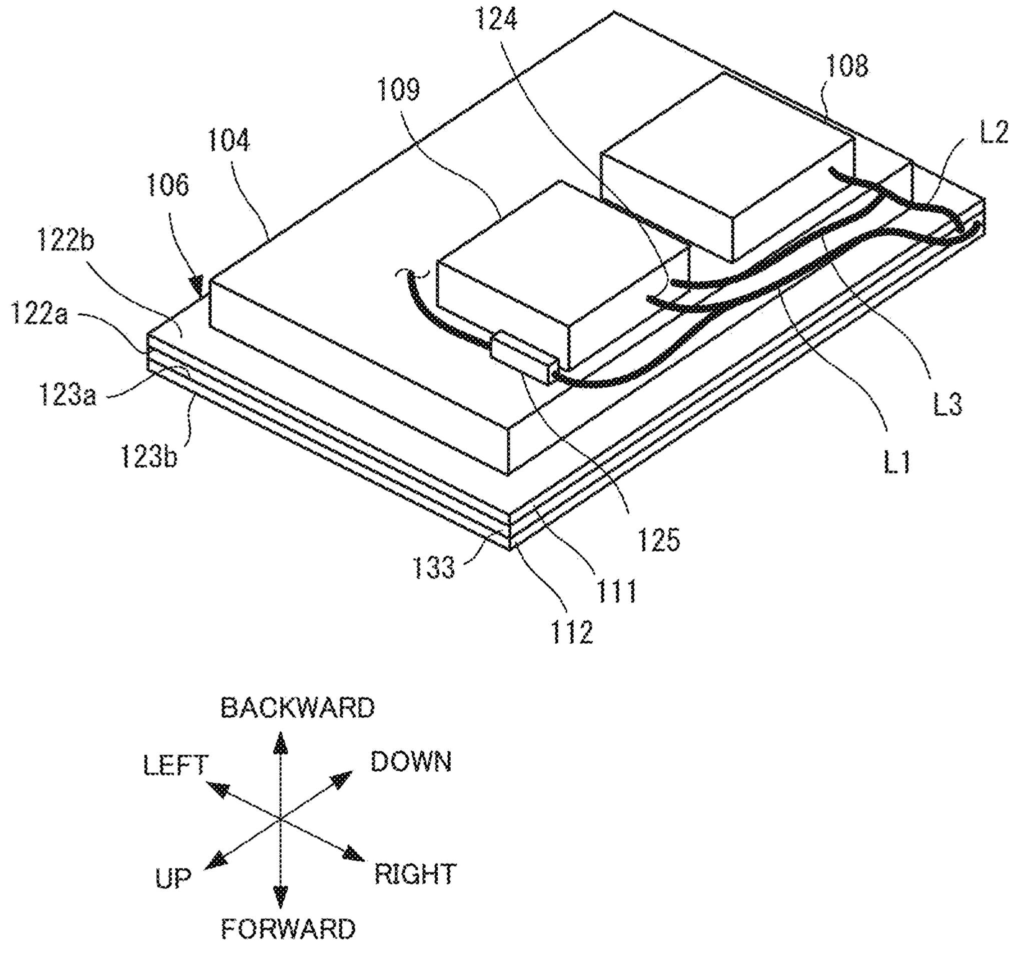
FIG. 4 is a rear perspective view of internal structure of the remote controller according to Embodiment 1.

The microcomputer 109 is disposed behind the display 104, for example, as illustrated in FIG. 4, and is enclosed within the cover 103. As illustrated in the drawing, the microcomputer 109 has an analog/digital (A/D) input port 124 to which an end of the second conductive path 114 (the left end in the present embodiment) is connected by a wire L1. The wire L1 branches off between the second conductive path 114 and the A/D input port 124 and is grounded (connected to a reference voltage) through a resistor 125.

The microcomputer 109 is a device for controlling the display 104, the air conditioner 102, and the like in accordance with input signals. Physical components of the microcomputer 109 include, for example, a processor for performing various types of arithmetic operations, a register for storing instructions, information, and the like, and a storage for storing data.

The input signals include a signal from the power supply button 107 in response to pressing thereof by the user, a signal from the touch panel 106 in response to pressing thereof by the user, a signal including environment information output from various sensors unillustrated), and the like. The environment information may be, for example, temperature measured by a temperature sensor, humidity measured by a humidity sensor, information about human presence or absence detected by a human presence sensor, or the like.

Figure 5:
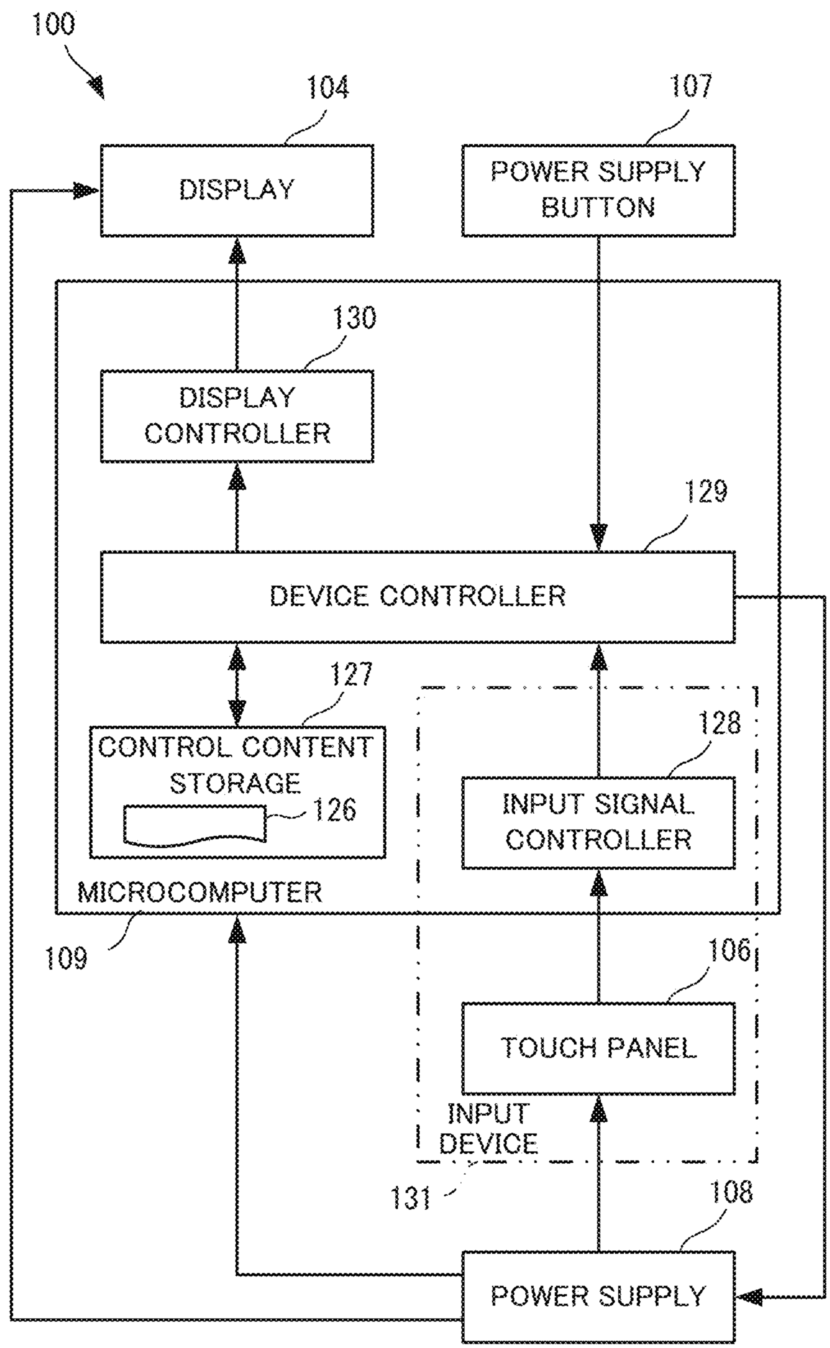
FIG. 5 illustrates functions of a microcomputer with which the remote controller according to Embodiment 1 is equipped.

As illustrated in FIG. 5, the microcomputer 109 according to the present embodiment functionally includes a control content storage 127 for storing beforehand therein control content data 126, an input signal controller 128 for determining, based on the input signal from the touch panel 106, which of the structures 105*a* to 105*i* is pressed, a device controller 129 for controlling the air conditioner 102 based on the pressed structure 105*a* to 105*i*, and a display controller 130 for causing display of an image on the display

104. These functions are implemented, for example, by the microcomputer 109 executing pre-loaded programs.

The control content data 126 defines control content corresponding to the pressed structure 105*a* to 105*i*. The control content includes content such as control for one or both of the air conditioner 102 and the remote controller 100. Control of the remote controller 100, for example, includes a change of an image displayed on the display 104, and the like.

Each item of the control content data 126 according to the present embodiment includes control content associated with a combination of the structure 105*a* to 105*i* and the screen ID, as illustrated in FIG. 6. The screen ID is information for identification of an image that is displayed on the screen of the display 104. For example, when a "structure b" is pressed while the image having a "screen ID" that is a "screen 1" is displayed, the microcomputer 109 controls one or both of the air conditioner 102 and the remote controller 100 in accordance with a "control B1".

The input signal controller 128 determines which of the structures 105*a* to 105*i* is pressed, based on a resistance value of an electric circuit formed upon the pressing of any of the structures 105*a* to 105*i*. Such an input signal controller 128, together with the touch panel 106, forms an input device 131 for accepting a user input operation to the remote controller 100.

Specifically, upon the pressing of any of the structures 105*a* to 105*i*, the corresponding minimum pressure-sensitive regions 1210*a* to 1210*i* are also pressed. Thus the first conductive path 113 makes an electrical contact with any of the pressure-detecting conductive paths 115*a* to 115*i* corresponding to the pressed structure 105*a* to 105*i* (minimum pressure-sensitive regions 1210*a* to 1210*i*). Thus an electric circuit is formed by the first conductive path 113, the second conductive path 114, and the pressure-detecting conductive paths 115*a* to 115*i* corresponding to the pressed structure 105*a* to 105*i*. The input signal controller 128 determines a resistance value of the electric circuit formed upon the pressing, based on a voltage value of the input signal that is input to the A/D input port 124. Then the input signal controller 128 determines which of the structures 105*a* to 105*i* is pressed, based on the resistance value of that electric circuit.

The device controller 129 controls one or more of the air conditioner 102, the remote controller 100, and the like, based on the structure 105*a* to 105*i* determined by the input signal controller 128 and based on the control content data 126.

The display controller 130 displays an image on the display 104 under the instruction of the device controller 129.

The microcomputer 109 installed in the remote controller 100 is not limited to a single microcomputer, and a processor for controlling the display 104 may be, for example, additionally mounted thereon. In addition to or alternatively to the storage of the microcomputer 109, a storage device such as relatively large-capacity flash memory may be mounted on the remote controller 100.

The power supply 108 is typically a device for conversion of commercial power, but may be a battery, a secondary battery, or the like. The power supply 108 may be provided in the remote controller 100 as appropriate, and for example, is provided behind the display 104 inside the cover 103, as illustrated in FIG. 4, which is a rearward direction view thereof.

The power supply 108 supplies, to the touch panel 106, direct current power for operation thereof. In the present embodiment, as illustrated the drawing, the power supply 108 is connected to an end of the first conductive path 113 (the left end in the present embodiment) by a wire L2. A voltage having a predetermined magnitude (for example, 5.0 V) is applied via the wire L2 to the first conductive path 113.

The power supply 108 supplies, to the microcomputer 109, direct current power for operation thereof. In the present embodiment, as illustrated in the drawing, power from the power supply 108 is supplied to the microcomputer 109 via a wire L3, which branches off from the wire L2. Thus the microcomputer 109 is supplied with power having the same magnitude as the first conductive path 113 (for example, 5.0 V direct current power).

Since the touch panel 106 and the microcomputer 109 both operate on power supplied from the same power supply 108, the need for a separate power supply 108 for each of the touch panel 106 and the microcomputer 109 is thus eliminated. This suppresses increase in the size of the input device 131 and in turn the size of the remote controller 100.

In the present embodiment, the voltage is applied to the first conductive path 113, and the second conductive path 114 is connected to the A/D input port 124 and grounded through the resistor 125. However, the first conductive path 113 may be connected to the A/D input port 124 and grounded through the resistor 125, and a predetermined magnitude of voltage may be applied to the second conductive path 114.

In the foregoing description, the structure of the remote controller 100 according to the present embodiment is described. Hereinafter, the operation of the remote controller 100 according to the present embodiment is described.

Figure 7:
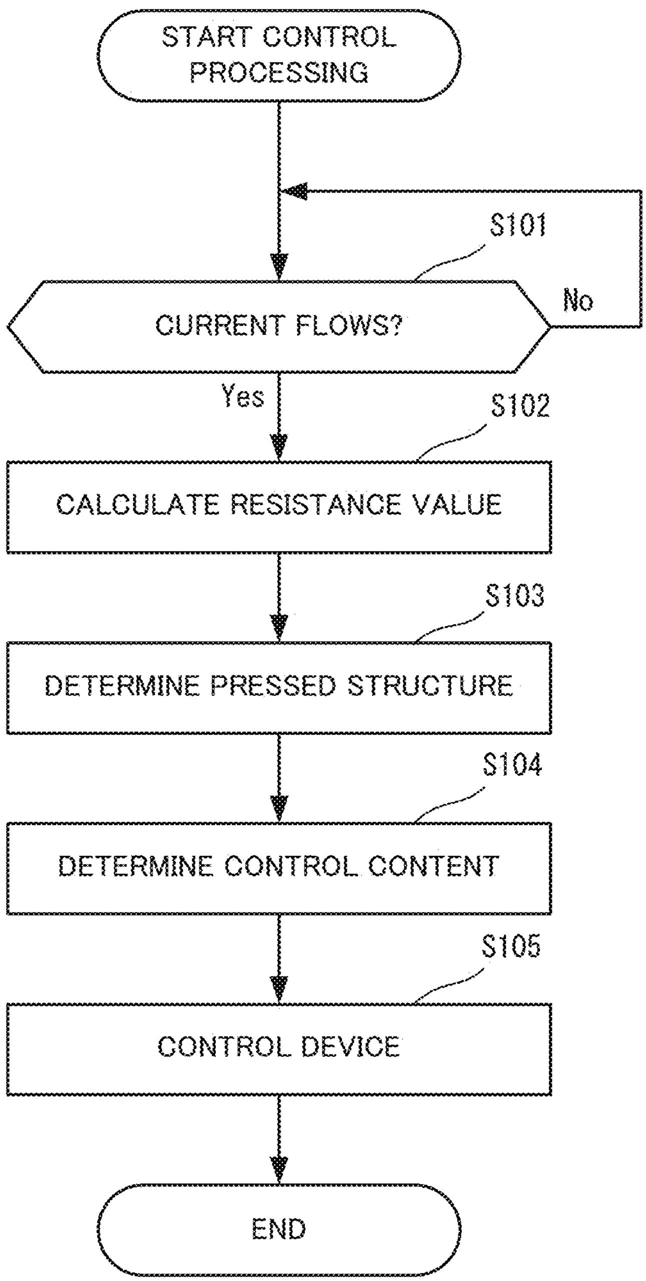
FIG. 7 is a drawing illustrating an example of control processing executed by the remote controller according to Embodiment 1.

The remote controller 100, when in the operating state, executes control processing as illustrated in FIG. 7. Here, the image as illustrated in FIG. 1 is assumed to be initially displayed.

The image displayed on the remote controller 100 as illustrated in FIG. 1 indicates the following: the air conditioner 102 is operating under "SETTING: 28.0° C.", "FAN: AUTO", and "COOL" (for example). The structures 105*a* to 105*d* are respectively associated with functions for switching the operation mode into the "COOL" mode, "DEHUMIDIFY" mode, "HEAT" mode, and "AUTO" mode. The structure 105*e* is associated with a function for switching the image to a predetermined "main" image. The structure 105*f* is associated with airflow switching in an order (for example, in the order of "AUTO", "HIGH", "LOW", and "VERY LOW"), and the structure 105*g* is associated with the airflow switching in the reverse order. The structure 105*h* is associated with reducing the temperature setting in predetermined decrements such as 0.5° C., and the structure 105*i* is associated with increasing the temperature setting in such predetermined increments.

The input signal controller 128 determines, based on an input signal to the A/D input port 124, whether current flows in the second conductive path 114 (step S101).

Figure 8:
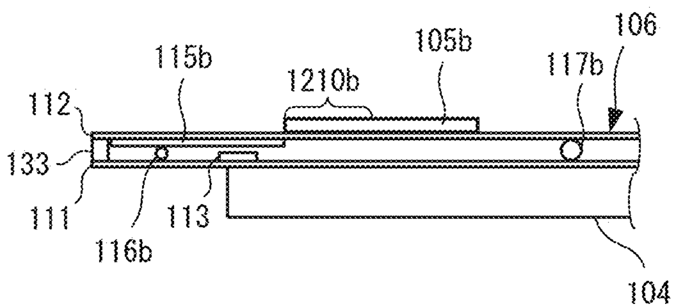
FIG. 8 is a cross-sectional view taken along a B-B cross section in an A-A portion of FIG. 3, illustrating a state in which a structure is not depressed.

For example, as illustrated in the cross-sectional view of FIG. 8, the pressure-detecting conductive path 115*b* corresponding to the structure 105*b* is spaced apart from the first conductive path 113. In this manner, when none of the structures 105*a* to 105*i* are pressed, all the pressure-detecting conductive paths 115*a* to 115*i* are spaced apart from the first conductive path 113. Thus the pressure-detecting conductive paths 115*a* to 115*i* are insulated from the first conductive path 113 (that is, the resistance therebetween is infinite), and the current flowing in the second conductive path 114 is nearly zero.

Hence, the input signal to the A/D input port 124 is not substantially input when none of the structures 105*a* to 105*i* are pressed. That is, even if the input signal is input to the A/D input port 124, the voltage of the input signal is very weak subthreshold noise. The input signal controller 128 compares a threshold with the voltage of the input signal to the A/D input port 124, and for example, determines that no current flows in the second conductive path 114 when the voltage is equal to or less than the threshold.

Figure 9:
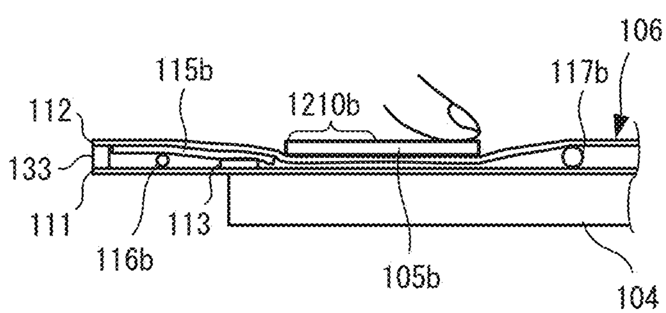
FIG. 9 is a cross-sectional view taken along the B-B cross section in the A-A portion of FIG. 3, illustrating a state in which the structure is depressed.
Figure 10:
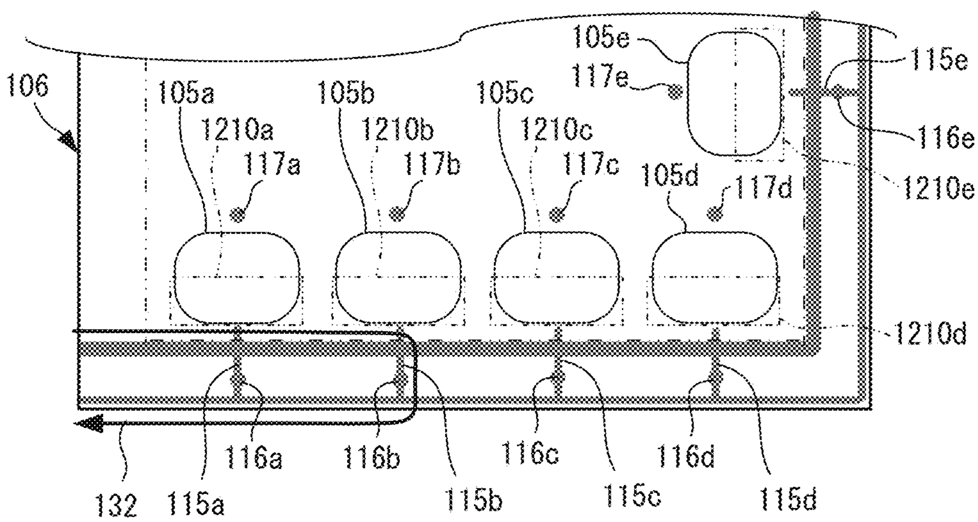
FIG. 10 is a drawing illustrating an example of an electrical circuit formed, due to pressing of the structure as illustrated in FIG. 9, by the first conductive path, the second conductive path, and the pressure-detecting conductive path.

For example, as illustrated in the cross-sectional view of FIG. 9, when the structure 105*b* is pressed, due to high hardness or stiffness of the structure 105*b*, the structure 105*b* uniformly sinks downward even when the edge of the structure 105*b* is pressed, and the second sheet 112 flexes, which makes electrical connection between the first conductive path 113 and the pressure-detecting conductive path 115*b* associated with the structure 105*b*. Thus even when the minimum pressure-sensitive region 1210*b* is pressed, due to second sheet 112 in the vicinity thereof flexing together with the pressure-detecting conductive path 115*b*, the pressure-detecting conductive path 115*b*, and the first conductive path 113 electrically contact each other. That is, the pressed structure 105*b* causes flexing of the associated pressure-detecting conductive path 115*b* so as to be brought into electrical contact with the first conductive path 113. Thus the first conductive path 113, the pressure-detecting conductive path 115*b*, and the second conductive path 114 form an electric circuit to cause a current flow in the electric circuit as indicated by an arrow 132 in FIG. 10. Thus the current flows through the electric circuit formed upon the pressing of the structure 105*b*, and the input signal is input to the A/D input port 124.

Similarly, when any of the structures 105*a* and 105*c* to 105*i* is pressed, one of the pressure-detecting conductive paths 115*a* and 115*c* to 115*i* corresponding to the pressed structure of the structures 105*a* and 105*c* to 105*i* electrically connects to the first conductive path 113. An electric circuit is thereby formed by the first conductive path 113, one of the pressure-detecting conductive paths 115*a* and 115*c* to 115*i* corresponding to the pressed structure of the structures 105*a* and 105*c* to 105*i*, and the second conductive path 114. Thus the current flows through the electric circuit formed upon the pressing of any of the structures 105*a* and 105*c* to 105*i*, and the input signal is input to the A/D input port 124.

Thus when any of the structures 105*a* to 105*i* is pressed, the input signal is input to the A/D input port 124. The input signal controller 128 compares a threshold with the voltage of the input signal to the A/D input port 124, and for example, determines that current flows in the second conductive path 114 when the voltage is greater than the threshold.

When the input signal controller 128 determines that no current flows (NO in step S101), the input signal controller 128 continues the processing of step S101.

Upon determination that current flows (YES in step S101), the input signal controller 128 calculates a resistance value on the basis of the voltage value of the input signal to the A/D input port 124 and a magnitude of a previously applied voltage (step S102).

Specifically, as described above with reference to FIG. 4, the voltage of the predetermined magnitude is applied to the first conductive path 113 through the wire L2. The voltage applied to the first conductive path 113 is divided into a voltage across a resistance (interconnection resistance) of the electric circuit formed upon the pressing and a voltage across the resistor 125.

The resistance value of the resistor 125 may be determined as appropriate in terms of design. Thus the input signal controller 128 can calculate a resistance value of the electric circuit corresponding to the pressed structure of the structures 105*a* to 105*i* on the basis of the voltage value of the input signal to the A/D input port 124 and the voltage value applied to the first conductive path 113.

In step S102, the input signal controller 128 thus determines, for example when the structure 105*b* is pressed, the resistance value of the electric circuit formed upon the pressing of the structure 105*b*.

The input signal controller 128 determines, on the basis of the resistance value calculated in step S102, which of the structures 105*a* to 105*i* is pressed (step S103).

Here, as described above, the first conductive path 113 and the second conductive path 114 extend along the outer edges of the image transmission regions 118 and 119. Further, the voltage is applied to one end of the first conductive path 113, and the current flowing from one end of the second conductive path 114 located adjacent to the one end of the first conductive path 113 is input to the A/D input port 124 as the input signal.

When any of the structures 105*a* to 105*i* is pressed, one of the pressure-detecting conductive paths 115*a* to 115*i* corresponding to the pressed structure is electrically connected to the first conductive path 113. Thus the length of the electric circuit formed upon the pressing of any of the structures 105*a* to 105*i* varies depending on which of the structures 105*a* to 105*i* is pressed. This electric circuit is formed by the one of the pressure-detecting conductive paths 115*a* to 115*i* corresponding to the pressed structure of the structures 105*a* to 105*i*, the first conductive path 113, and the second conductive path 114.

Thus the resistance value calculated in step S102 varies depending on which of the structures 105*a* to 105*i* is pressed.

For example, the input signal controller 128 may previously store data inter-associating the structures 105*a* to 105*i* and the resistance values. The input signal controller 128 may determine the pressed structure of the structures 105*a* to 105*i* on the basis of the data and the resistance value calculated in step S102. The resistance values included in the data and associated with the respective structures 105*a* to 105*i* may be set to have a range such as a range from X1 [Ω] to X2 [Ω] since some error is tolerable.

The device controller 129 acquires data indicating one of the structure 105*a* to 105*i* determined in step S103. The device controller 129 identifies a screen ID of the image being displayed on the display 104. The screen ID of the image being displayed may be stored, for example, in the device controller 129. The device controller 129 determines the control content on the basis of the structure 105*a* to 105*i* indicated by the acquired data, the identified screen ID, and the control content data 126 (step S104).

For example, when the "screen ID" of the image illustrated in FIG. 1 is "screen 1" and the "structure b" is pressed, the device controller 129 determines the control content, that is, "control B1", by referring to the control content data illustrated in FIG. 6.

The device controller 129 controls, in accordance with the control content determined in step S104, one or more of the air conditioner 102, the remote controller 100, and the like (step S105).

As described above in the example illustrated in FIG. 1, "structure b" is associated with a function of switching to the "DEHUMIDIFY" mode after the pressing of "structure b".

Thus the device controller 129 switches the operation mode of the air conditioner 102 from the cooling mode to the dehumidification mode.

Figure 11:
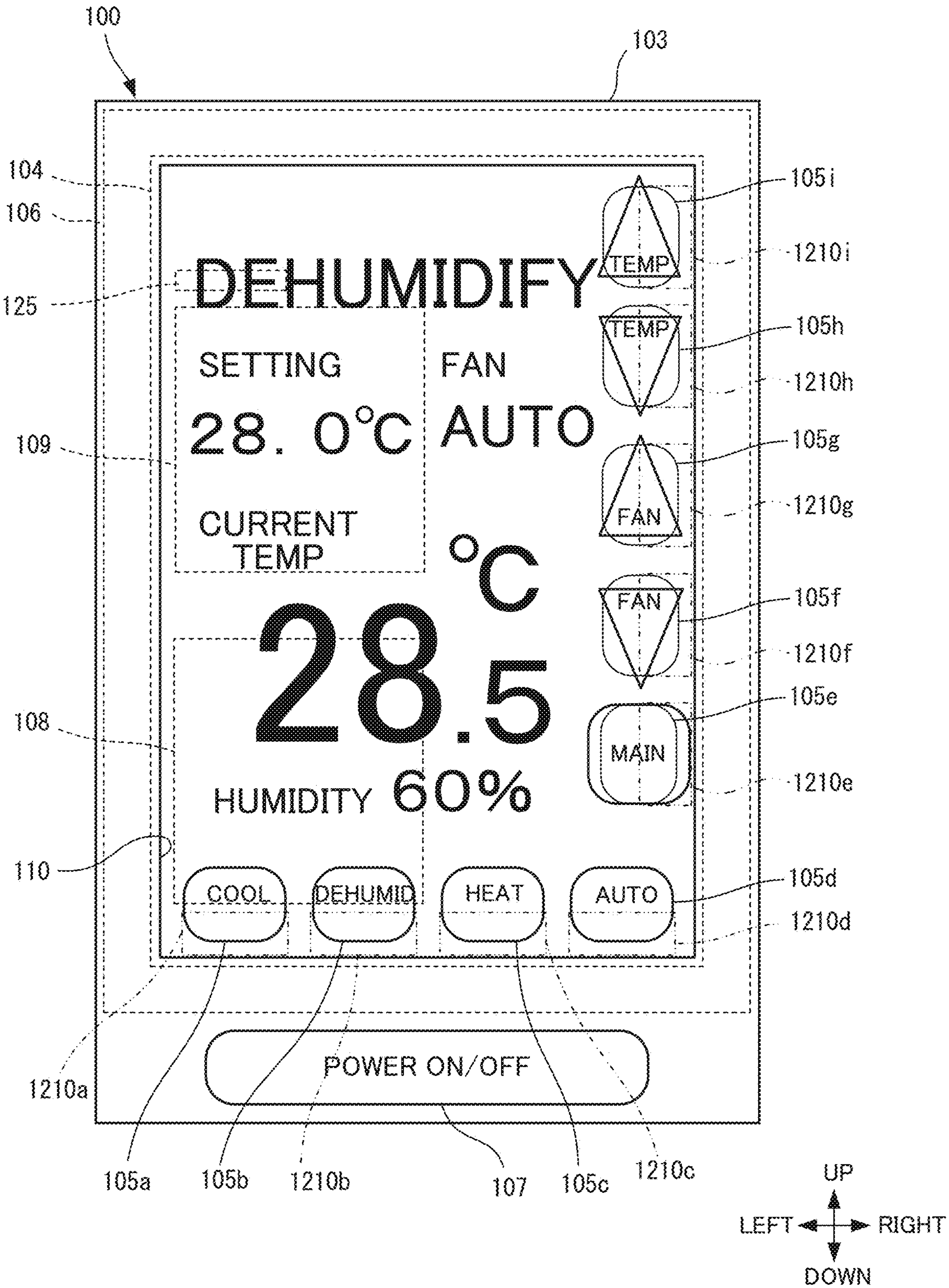
FIG. 11 is a drawing illustrating an example of an image changed by pressing of the structure as illustrated in FIG. 9.

Further, the device controller 129 outputs an instruction to the display controller 130 to cause the image displayed on the display 104 to be switched to the image illustrated in FIG. 11. In response to the instruction, the display controller 130 generates image data for displaying the image illustrated in FIG. 11, and then causes the display 104 to display the image. In the image as illustrated in FIG. 11, "COOL" in FIG. 1 is replaced with "DEHUMIDIFY".

Accordingly, the remote controller 100 according to the present embodiment enables determination of which of the structures 105*a* to 105*i* of the touch panel 106 is depressed. The air conditioner 102, the remote controller 100, and the like are controlled to cause operation depending on the which structure is pressed of the structures 105*a* to 105*i*.

In the foregoing description, the operation of the remote controller 100 according to the present embodiment is described. Hereinafter a method for manufacturing the remote controller 100 according to the present embodiment is described.

Figure 12:
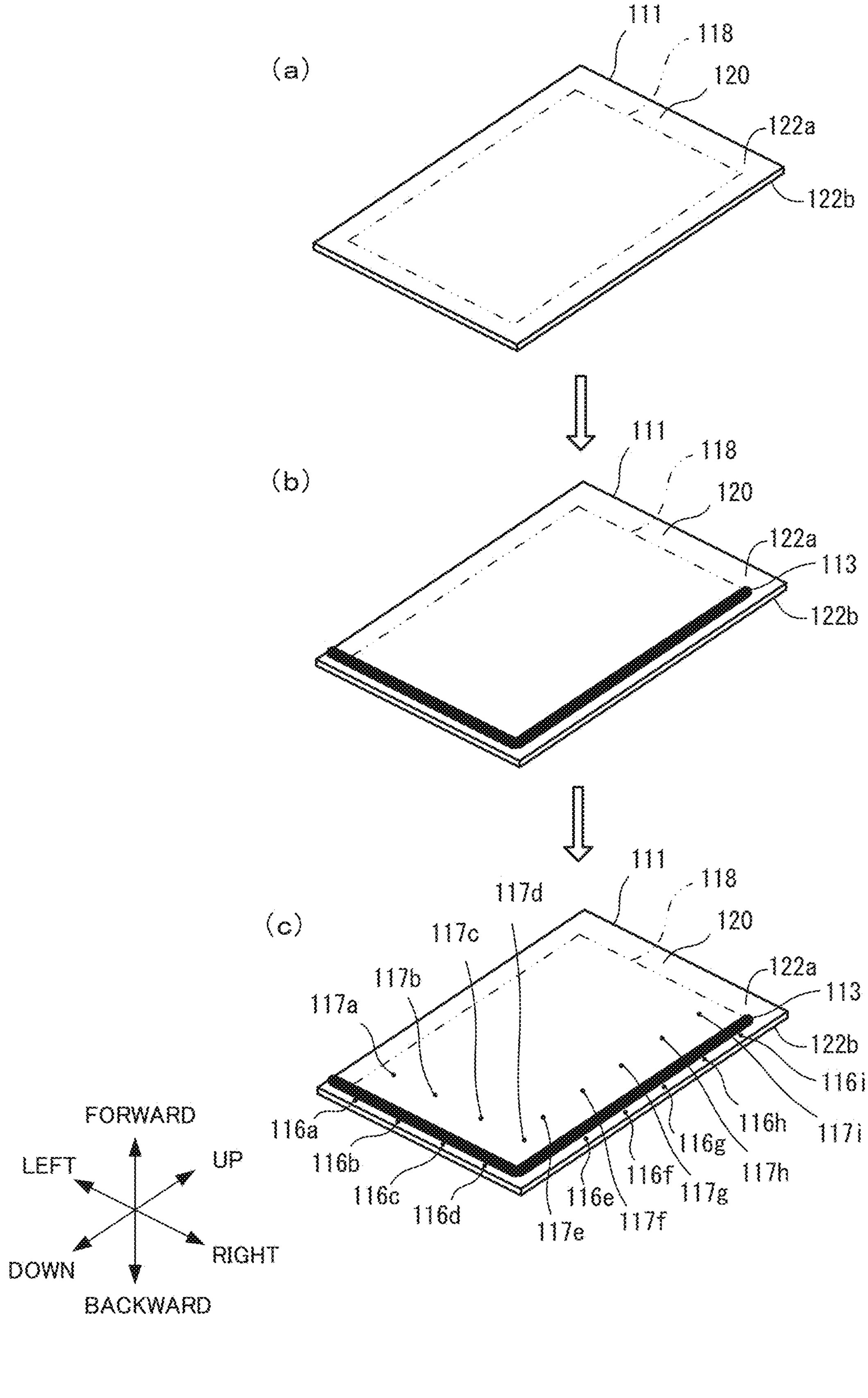
FIG. 12 shows drawings illustrating an example of processing to arrange a first conductive path and the spacer on a first sheet according to Embodiment 1.

The first sheet 111 is prepared as illustrated in diagram (a) of FIG. 12.

As illustrated in diagram (b) of FIG. 12, the first conductive path 113 is arranged along the outer edge of the image transmission region 118 on the first main surface 122*a* of the first sheet 111. The first conductive path 113 is provided by printing of conductive ink. In the present embodiment, the first conductive path 113 is arranged along the lower side and the right side of the image transmission region 118.

As illustrated in diagram (c) of FIG. 12, the spacers 116*a* to 116*i* and 7*a* to 117*i* are disposed on the first main surface 122*a* of the first sheet 111.

The spacers 116*a* to 116*i* are disposed on the respective pressure-detecting conductive paths 115*a* to 115*i*. Further, the spacers 116*a* to 116*i* are disposed between the position where the second conductive path 114 is to be disposed and the position of the first conductive path 113, as viewed from the forward direction.

One each of the spacers 117*a* to 117*i* is disposed in a corresponding region in the image transmission region 118 of the first sheet 111. Each of the regions in Which the respective spacers 117*a* to 117*i* are disposed is a region located in a direction in which the pressure-detecting conductive paths 115*a* to 115*i* are each extended, as viewed from the front, with the second sheet 112 stacked on the first sheet 111.

Figure 13:
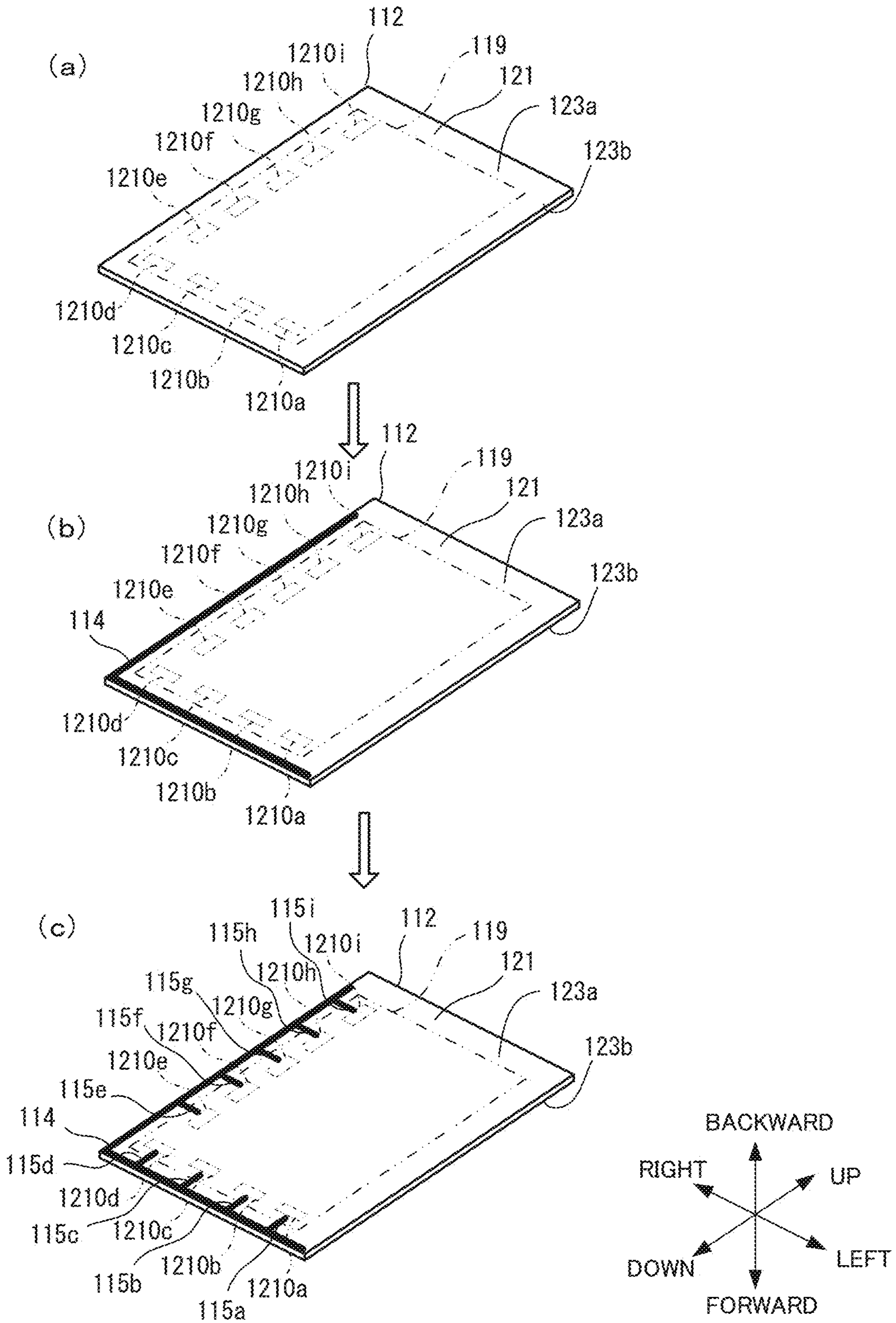
FIG. 13 shows drawings illustrating an example of processing to arrange a second conductive path and a pressure-detecting conductive path on the second sheet according to Embodiment 1.

The second sheet 112 is prepared as illustrated in diagram (a) of FIG. 13.

As illustrated in diagram (b) of FIG. 13, the second conductive path 114 is disposed along the outer edge of the surrounding area 121 on the second main surface 123*a* of the second sheet 112. The second conductive path 114 is provided by printing of conductive ink. The second conductive path 114 is disposed in a position spaced apart from the first conductive path 113 as viewed from the front, when the first sheet 111 and the second sheet 112 made to oppose each other. In the present embodiment, the second conductive path 114 is disposed, in the surrounding area 121 of the second sheet 112, within the surrounding area 121 of the second sheet 112, and in the lower portion of the surrounding area 121 below the lower side of the image transmission region 119 and in the right portion of the surrounding area 121 farther to the right than the right side of the image transmission region 119.

As illustrated in diagram (c) of FIG. 13, each of the pressure-detecting conductive paths 115*a* to 115*i* is disposed on the second main surface 123*a* of the second sheet 112. The pressure-detecting conductive paths 115*a* to 115*i* are each provided by printing of conductive ink. The pressure-detecting conductive paths 115*a* to 115*i* are each provided to be electrically connected with the second conductive path 114. The pressure-detecting conductive paths 115*a* to 115*i* are each disposed to intersect the first conductive path 113 as viewed from the forward direction with the first sheet 111 and the second sheet 112 opposing each other.

Figure 14:
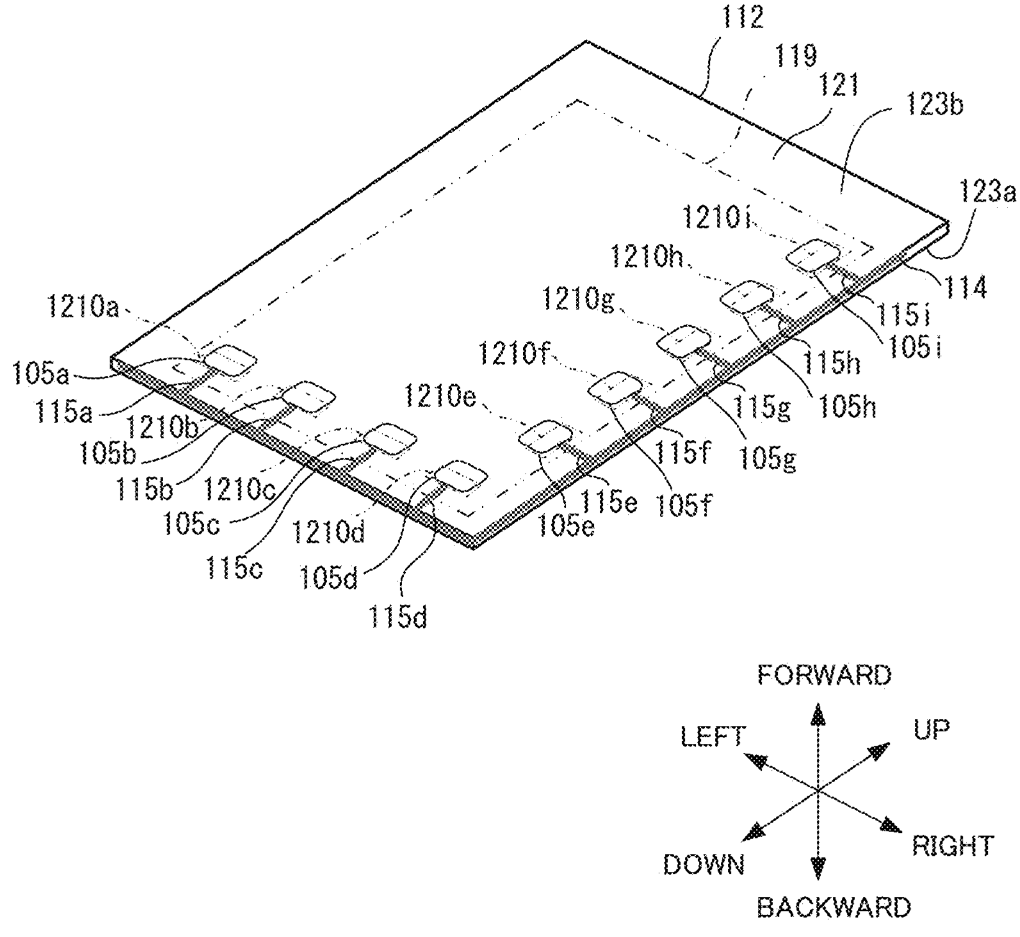
FIG. 14 is a drawing illustrating an example of processing to arrange structures on the second sheet according to Embodiment 1.

Further, as illustrated in FIG. 14, each of the structures 105*a* to 105*i* is arranged on the fourth main surface 123*b* of the second sheet 112. Each of the structures 105*a* to 105*i*, corresponding to the pressure-detecting conductive paths 115*a* to 115*i*, is arranged within the image transmission region 119 of the second sheet 112. For example, the structures 105*a* to 105*i* are fixed (attached) by adhesive or double-sided tape so as to partially overlap the minimum pressure-sensitive regions 1210*a* to 1210*i*.

The first sheet 111 on which the first conductive path 113 is disposed and the second sheet 112 on which the second conductive path 114 and the pressure-detecting conductive paths 115*a* to 115*i*, and the structures 105*a* to 105*i* are disposed are fixed, with the first main surface 122*a* and the second main surface 123*a* opposing each other. Here, the image transmission region 118 of the first sheet 111 and the image transmission region 119 of the second sheet 112 are disposed so as to be aligned with each other in the front-back direction. Examples of fixing techniques include use of an adhesive 133 applied to the outer edge portions of the first main surface 122*a* or the second main surface 123*a* (for example, see FIG. 8). Double-sided tape may be used for fixing attachment. The touch panel 106 according to the present embodiment is manufactured in this manner.

As illustrated in FIG. 4, the screen of the display 104 is fixed to face the rear surface (the third main surface 122*b*) of the touch panel 106, and the microcomputer 109 and the power supply 108 are each fixed on the rear surface of the display 104. Screws, adhesives, double-sided tape, and the like may be used for the fixing as appropriate. The one end of the second conductive path 114 is electrically connected to the A/D input port 124 of the microcomputer 109 by the wire L1 having a branch line with the resistor 125 disposed thereon. The one end of the first conductive path 113 is connected to the power supply 108 by the wire L2.

The touch panel 106, the display 104, the microcomputer 109, the power supply 108, and the like, all of which are assembled as described above, are enclosed within the cover 103. The remote controller 100 is thereby manufactured. The end portion of the branch line of the wire L1 is grounded during installation of the remote controller 100.

According to the present embodiment, when the structure 105*a* to 105*i* having high hardness or stiffness is pressed, the pressed structure 105*a* to 105*i* uniformly sinks downward. Thus the corresponding minimum pressure-sensitive region 1210*a* to 1210*i* is also pressed, and the surrounding second sheet 112 flexes such that electrical connection is made between the corresponding pressure-detecting conductive path 115*a* to 115*i* and the first conductive path 113. Thus there is no requirement to provide a transparent conductive film, for sensing that the structure 105*a* to 105*i* is pressed, on any of the first sheet 111 or the second sheet 112. For example, arranging the first conductive path 113 on the first sheet 111, and arranging the second conductive path 114, the pressure-detecting conductive paths 115*a* to 115*i*, and the structures 105*a* to 105*i* on the second sheet 112, are sufficient. Such arrangement enables simplification of the configuration of the touch panel 106. Further, wherever the pressed location of the structure 105*a* to 105*i*, due to the uniform force applied from the structure having high hardness or stiffness, electrical contact is possible between the first conductive path 113 and the pressure-detecting conductive path 115*a* to 115*i*, and thus the switch range can be appropriately expanded.

Further, according to the present embodiment, when any of the structures 105*a* to 105*i* corresponding to the pressure-detecting conductive paths 115*a* to 115*i* is pressed, electrical contact is made between the first conductive path 113 and the pressure-detecting conductive path 115*a* to 115*i* corresponding to the pressed structure 105*a* to 105*i*. The electrical circuit is thus formed. Length of the electrical circuit formed by pressing differs in accordance with the pressed structure 105*a* to 105*i*. Thus merely by applying a voltage to either the first conductive path 113 or the second conductive path 114, which of the structures 105*a* to 105*i* is pressed can be determined on the basis of the resistance value of the circuit formed by pressing. This thus enables simplification of the configuration for detection of which of the structures 105*a* to 105*i* is pressed among the structures 105*a* to 105*i*.

According to the present embodiment, applying a predetermined voltage to the first conductive path 113 is sufficient, so that switching is not required between the conductive paths 113 and 114 to which the voltage is to be applied. This simplifies the configuration for detection of the pressed structure 105*a* to 105*i*. Detection of the pressed structure 105*a* to 105*i* is thus enabled by a simple configuration.

According to the present embodiment, the voltage of the input signal that is input to the A/D input port 124 of the microcomputer 109 is nearly equal to the voltage at the one end of the second conductive path 114. Thus, measurement of the voltage of the input signal that is input to the A/D input port 124 enables determination of which of the structures 105*a* to 105*i* is pressed. The pressed structure 105*a* to 105*i* can be detected in this manner even without an additional sensor for measuring the voltage at the one end of the second conductive path 114. This enables simplification of the configuration for detection of the pressed structure 105*a* to 105*i*. Thus detection of the pressed structure 105*a* to 105*i* is enabled using a simple configuration.

In the present embodiment, the first conductive path 113 is disposed in parallel to the outer edge of the image transmission region 118, and the second conductive path 114 is disposed in parallel to the outer edge of the image transmission region 119. Such parallel arrangement may allow the manufacturing of the touch panel 106 by disposing pressure-detecting conductive paths 115*a* to 115*i* of a fixed length. Such configuration enables easy manufacture of the touch panel 106.

Embodiment 1 of the present disclosure is described above, but is not limited to the description above.

For example, the target to be controlled (a control target device) by the remote controller 100 is not limited to the air conditioner 102, and may be an electric device such as, for example, a lighting device, a hot water heater, and the like. The input device 131 is not limited to the remote controller 100, and various apparatuses, devices, or the like such as electrical apparatuses and terminal devices may be used.

For example, examples of both the first sheet 111 and the second sheet 112 are described as entirely transparent sheets in the present embodiment. However, the surrounding area 120 in the first sheet 111 and the surrounding area 121 in the second sheet 112 need not be transparent provided that at least the image transmission regions 118 and 119 are transparent. The image transmission regions 118 and 119 having a size and shape allowing transmission through at least a predetermined range of the screen of the display 104 are sufficient.

For example, an example is described in the present embodiment in which the screen of the display 104 is located behind the third main surface 122*b*. However, the touch panel 106 may be arranged back-to-front in the remote controller 100 relative to the orientation of the touch panel 106 in the present embodiment. In this case, the screen of the display 104 is located behind the fourth main surface 123*b*, and the third main surface 122*b* forms the front surface of the remote controller 100.

Figure 15:
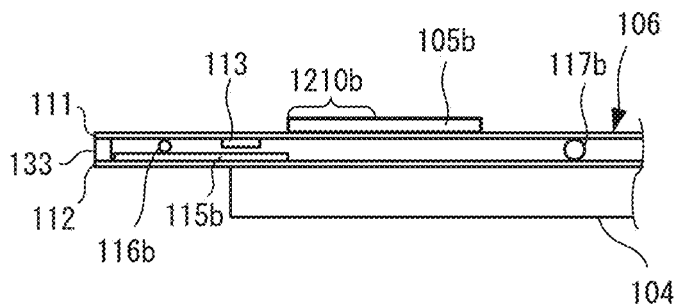
FIG. 15 is a cross-sectional view illustrating the state in which the structure is not pressed in a case in which the second conductive path and the pressure-detecting conductive path are provided on the first sheet and the first conductive path and the structure are provided on the second sheet.

In this arrangement, as illustrated in the cross-sectional view of FIG. 15 for example, the structures 105*a* to 105*i* are arranged on the third main surface 122*b* of the first sheet 111, that is, on the outer surface of the first sheet 111. FIG. 15 illustrates the structure 105*b* as an example. The structures 105*a* to 105*i* are arranged within the image transmission region 118 of the first sheet 111 at locations corresponding to the pressure-detecting conductive paths 115*a* to 115*i*. For example, the structures 105*a* to 105*i* are fixed by adhesive or double-sided tape so as to partially overlap the minimum pressure-sensitive regions 1210*a* to 1210*i*.

Figure 16:
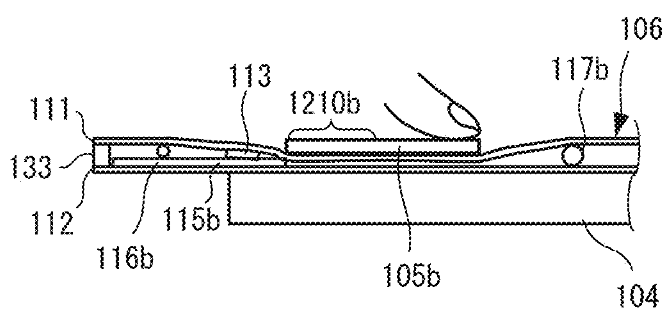
FIG. 16 is a cross-sectional view illustrating the state in which the structure is pressed in the case in which the second conductive path and the pressure-detecting conductive path are provided on the first sheet and the first conductive path and the structure are provided on the second sheet.

Then when the structure 105*b* is pressed as illustrated in the cross-sectional view of FIG. 16, for example, due to high hardness or stiffness of the structure 105*b*, the structure 105*b* uniformly sinks downward even when the edge of the structure 105*b* is pressed. In this manner, the minimum pressure-sensitive region 1210*b* is also pressed, the first sheet 111 in the periphery of the pressed portion flexes together with the first conductive path 113, and thus the first conductive path 113 and the pressure-detecting conductive path 115*b* are electrically connected. That is, the pressed structure 105*b* causes flexing of the first conductive path 113 so that electrical contact is made with the associated pressure-detecting conductive path 115*b*. Also in this case, configuration of the touch panel 106 can be simplified, and the switch range can be appropriately expanded.

Further, for example, any or all of the first conductive path 113, the second conductive path 114, and the pressure-detecting conductive paths 115*a* to 115*i* may be formed of materials other than conductive ink, and may be a thin wire of silver, copper, and the like.

For example, the first conductive path 113 may be disposed at any position of the first main surface 122*a*. Disposal of the second conductive path 114 on the second main surface 123*a* at a position spaced apart from the first conductive path 113 as viewed from the front is sufficient. Forming the pressure-detecting conductive paths 115*a* to 115*i* on the second main surface 123*a* to be electrically connected with the second conductive path 114 so as to intersect the first conductive path 113 as viewed from the front is sufficient.

However, visibility to the human eye is possible if the first conductive path 113 is a line having a width of approximately 0.1 mm. Visibility of the screen may be reduced when the first conductive path 113 having such a width occupies a place in front of the screen. However, the first conductive path 113 does not occupy a place in front of the screen if the first conductive path 113 is disposed on the outer edge of the image transmission region 118 of the first sheet 111 as in the present embodiment, or if the first conductive path 113 of the first sheet 111 is disposed in the surrounding area 120. Such configuration enables prevention of the reduction in the visibility of the screen.

In addition, similarly to the first conductive path 113, disposing the second conductive path 114 and the pressure-detecting conductive paths 115*a* to 115*i* on the outer edge or in the surrounding area 121 of the image transmission region 119 of the second sheet 112 enables prevention of the reduction in the visibility of the screen.

Embodiment 2

Figure 17:
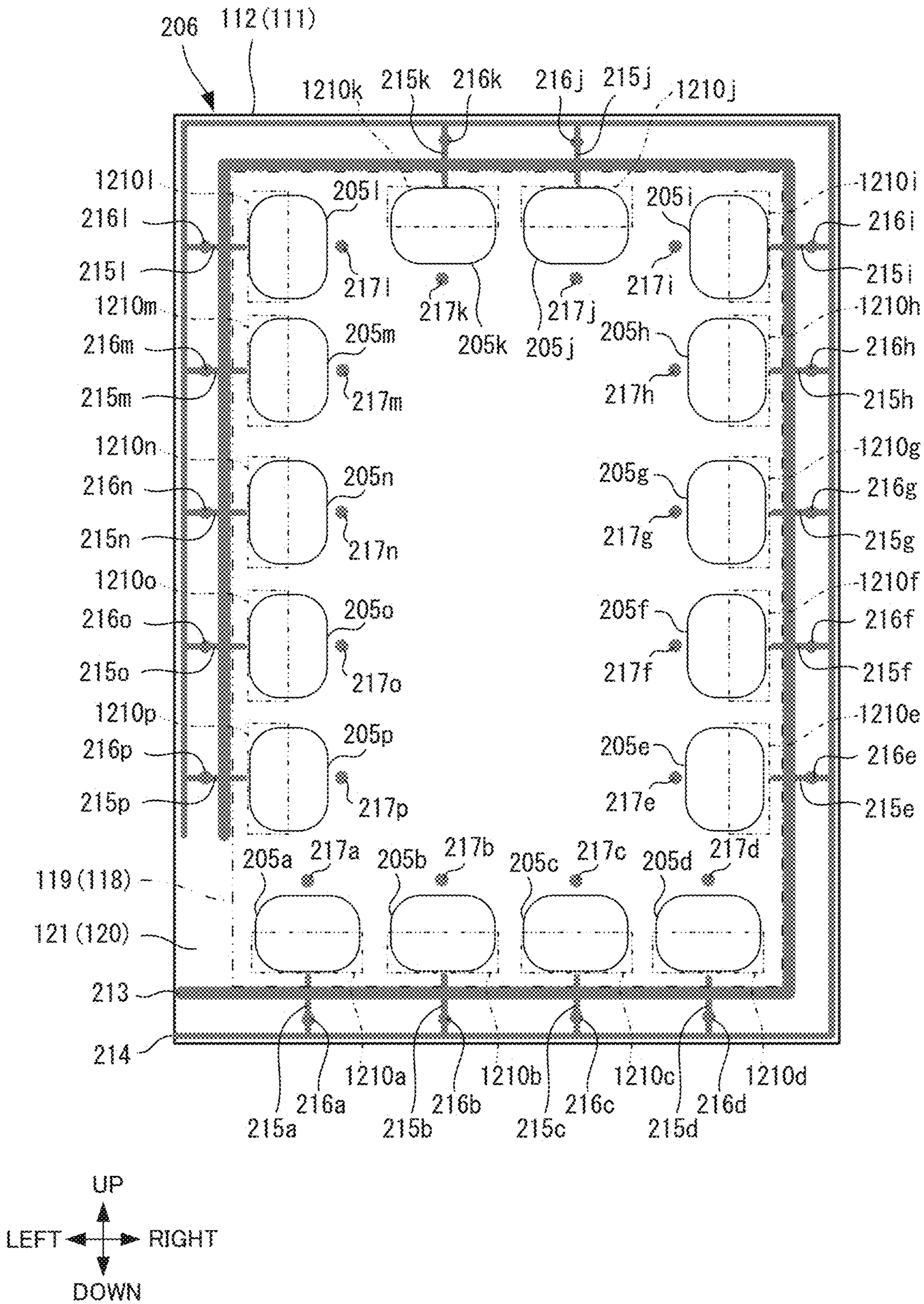
FIG. 17 is a front view of a touch panel according to Embodiment 2 of the present disclosure.

As illustrated in FIG. 17, which is a front view of the touch panel 206 of the present embodiment, a difference between a touch panel 206 according to the present embodiment and the touch panel 106 according to Embodiment 1 lies in the ranges in which the first conductive path 213, the second conductive path 214, the pressure-detecting conductive paths 215*a* to 215*p*, and the structures 205*a* to 205*p* are disposed.

Specifically, as illustrated in the drawing, the first conductive path 213 and the second conductive path 214 are disposed to surround the image transmission regions 118 and 119, that is, are disposed substantially along the entire outer edges of the image transmission regions 118 and 119. The pressure-detecting conductive paths 215*a* to 215*p* are spaced substantially evenly in directions parallel to the respective four sides of the outer edges of the image transmission regions 118 and 119. As illustrated in the drawing, the structures 205*a* to 205*p*, spacers 216*a* to 216*p* and 217*a* to 217*p* are disposed in association with the pressure-detecting conductive paths 215*a* to 215*p*. The other components of the touch panel 206 are similar to those of the touch panel 106 according to Embodiment 1. That is, the minimum pressure-sensitive regions 1210*a* to 1210*p* are, as viewed from the front, defined between the first conductive path 213 and each of the regions in which the spacers 217*a* to 217*p* are arranged.

In the state in which the structures 205*a* to 205*p* are not pressed, in the minimum pressure-sensitive regions 1210*a* to 1210*p*, the spacers 217*a* to 217*p* enable the maintenance of a gap between the second sheet 112 and the first sheet 111 that oppose each other in the front-back direction. Then when any of the structures 205*a* to 205*p* is pressed, the gap in between the first sheet 111 and the second sheet 112 at the minimum pressure-sensitive region 1210*a* to 1210*p* corresponding to the pressed structure 205*a* to 205*p* becomes narrower. As a result of such narrowing, the pressure-detecting conductive path 215*a* to 215*p* corresponding to the pressed structure 205*a* to 205*p* can be made to reliably flex together with the second sheet 112 so as to enable electrical contact with the first conductive path 213.

In the present embodiment, the first conductive path 213 and the second conductive path 214 are disposed to surround the image transmission regions 118 and 119. Thus as illustrated in FIG. 16, the structures 205*a* to 205*p* can be arranged along the outer edge of the image transmission regions 118 and 119. Such configuration enables the arrangement of a larger number of structures 205*a* to 205*p* in comparison to the touch panel 106 in Embodiment 1.

Embodiment 3

Figure 18:
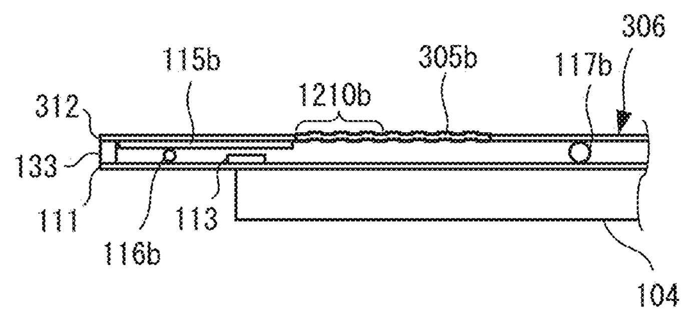
FIG. 18 is a cross-sectional view illustrating a state in which a structure of a touch panel according to Embodiment 3 of the present disclosure is not pressed.
Figure 19:
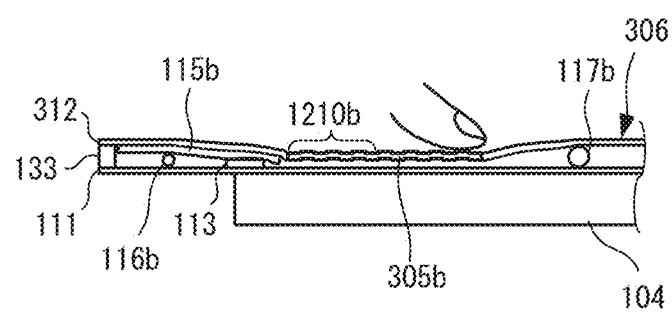
FIG. 19 is a cross-sectional view illustrating a state in which the structure of the touch panel according to Embodiment 3 of the present disclosure is pressed.

As illustrated in FIG. 18, which is a cross-sectional view, a portion of the touch panel 306 according to the present embodiment, corresponding to the structures 105*a* to 105*i* of Embodiment 1, is different from that of the touch panel 106 according to Embodiment 1 in that the portion has, instead of the structures, surface processed parts 305*a* to 305*i* where the surface of the second sheet 312 is processed to increase stiffness and/or hardness. FIG. 19 illustrates a surface-processed part 305*b* as an example.

Specifically, the surface-processed parts 305*a* to 305*i* are parts where an effect is obtained, similar to that of the structures 105*a* to 105*i*, by using creasing, embossing, and the like to increase stiffness and/or hardness in comparison to the surface of the second sheet 312 at the unprocessed part.

In Embodiment 3, for example, as illustrated in the cross-sectional view of FIG. 19, when the surface-processed part 305*b* is pressed, due to high hardness or stiffness of the surface-processed part 305*b*, the surface-processed part 305*b* uniformly sinks downward even when the edge of the surface-processed part 305*b* is pressed. Thus the minimum pressure-sensitive region 1210*b* is pressed, and due to flexing of the second sheet 312 in the periphery of the pressed portion, the pressure-detecting conductive path 115*b* and the first conductive path 113 are electrically connected. That is, electrical connection is made between the first conductive path 113 and the pressure-detecting conductive path 115*b* associated with the pressed surface-processed part 305*b*.

In this manner, the touch panel 306 outputs a signal that corresponds to the pressed surface-processed part 305*a* to 305*i*. The remaining configuration of the touch panel 306 is similar to that of the touch panel 106 according to Embodiment 1. The present embodiment enables the obtaining of an effect similar to that of the touch panel 106 of Embodiment 1 while using fewer components.

Embodiment 4

Figure 20:
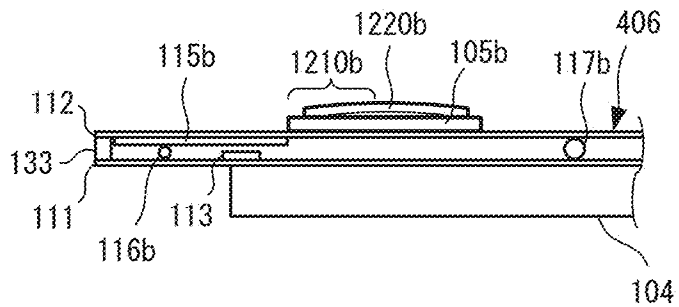
FIG. 20 is a cross-sectional view illustrating a state in which a structure of a touch panel according to Embodiment 4 of the present disclosure is not pressed.

As illustrated in FIG. 20, which is a cross-sectional view, tactile parts 1220*a* to 1220*i* in a touch panel 406 according to the present embodiment are disposed so as to be stacked upon the structures 105*a* to 105*i*. FIG. 20 illustrates the tactile part 1220*b* as an example. That is, as viewed in the normal direction of the first sheet 111, the tactile parts 1220*a* to 1220*i* can be disposed in a range that is a portion of, or is greater than or equal to, the entirety of the structures 105*a* to 105*i*. The tactile parts 1220*a* to 1220*i* are components characterized as being made of a material that is different from that of the structures 105*a* to 105*i*, and the structures 105*a* to 105*i* can be operated through a touch panel 406 without being directly touched.

Figure 21:
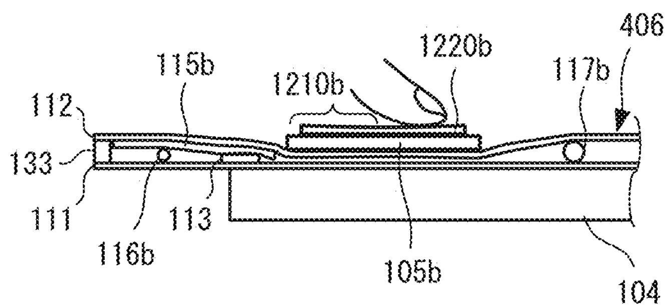
FIG. 21 is a cross-sectional view illustrating a state in which the structure of the touch panel according to Embodiment 4 of the present disclosure is depressed.

Further, the user during operation of the touch panel 406, due to the substance or configuration of the tactile part 1220*a* to 1220*i*, can be given a different feel when the structure 105*a* to 105*i* is pressed that differs. For example, in a case such as illustrated in the cross-sectional view of FIG. 21 in which the tactile part 1220*b* is made of a substance such as a rubber or an elastic resin, the user feels softness when pressing the tactile part 1220*b*, and the structure 105*b* is also pressed down by the tactile part 1220*b*. Due to the high hardness or stiffness of the structure 105*b*, the structure 105*b* sinks downward uniformly, the minimum pressure-sensitive region 1210*b* is also pressed, and due to flexing of the second sheet 112 in the periphery of the pressed portion, the pressure-detecting conductive path 115*b* and the first conductive path 113 are electrically connected.

In this manner, the touch panel 406 outputs a signal in accordance with the pressed tactile part 1220*a* to 1220*i* (structure 105*a* to 105*i*). The remaining configuration of the touch panel 406 is similar to that of the touch panel 106 according to Embodiment 1.

The user in the present embodiment operates the touch panel 406 by pressing the tactile parts 1220*a* to 1220*i*, and thus a soft feel can be imparted to the user in comparison to the direct pressing of the structures 105*a* to 105*i* as in the touch panel 106 according to Embodiment 1.

Embodiment 5

Figure 22:
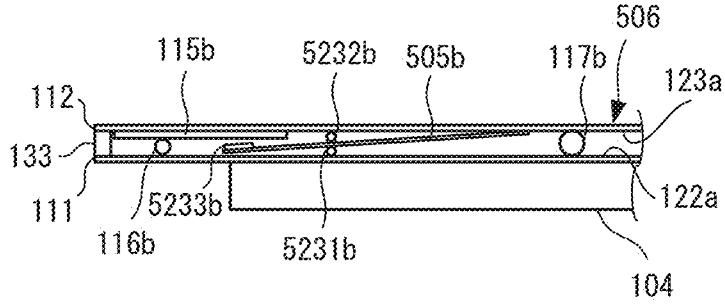
FIG. 22 is a cross-sectional view illustrating a state in which a structure of a touch panel according to Embodiment 5 of the present disclosure is not pressed.

As illustrated in the cross-sectional view of FIG. 22, in the touch panel 506 according to the present embodiment, structures 505*a* to 505*i* with the substrate-mounted contact points 5233*a* to 5233*i* are also disposed between the first main surface 122*a* of the first sheet 111 and the second main surface 123*a* of the second sheet 112 of the touch panel 506. Further, FIG. 22 illustrates the structure 505*b* as an example. That is, the substrate-mounted contact point 5233*b* is formed at an end portion of the structure 505*b*, is sandwiched between a paste stacked layer 5231*b* and a spacer 5232*b*, and is disposed between the first sheet 111 and the second sheet 112. In the same manner, the structures 505*a* and 505*c* to 505*i* with the substrate-mounted contacts points 5233*a* and 5233*c* to 5233*i* are also disposed between the first sheet 111 and the second sheet 112.

Figure 23:
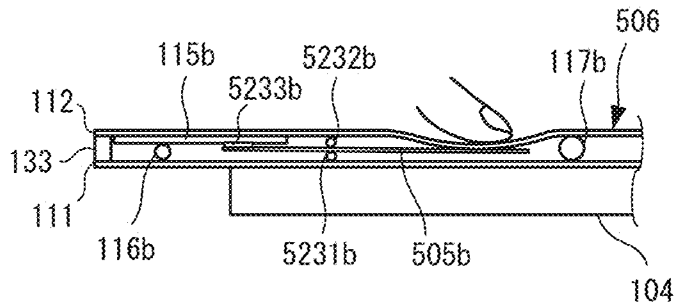
FIG. 23 is a cross-sectional view illustrating a state in which the structure of the touch panel according to Embodiment 5 of the present disclosure is pressed.

In the present embodiment, for example, as illustrated in the cross-sectional view of FIG. 23, when the user presses the position at which the structure 505*b* is disposed in the normal direction of the touch panel 506, the structure 505*b*, that is, a left side thereof as seen in the drawing, rises by pivoting around a fulcrum point of the paste stacked layer 5231*b* and the spacer 5232*b*, and the substrate-mounted contact point 5233*b* contacts the pressure-detecting conductive path 115*b*. At this time, the touch panel 506 functions as a switch due to a change in electrical characteristics of the touch panel 506.

Figure 24:
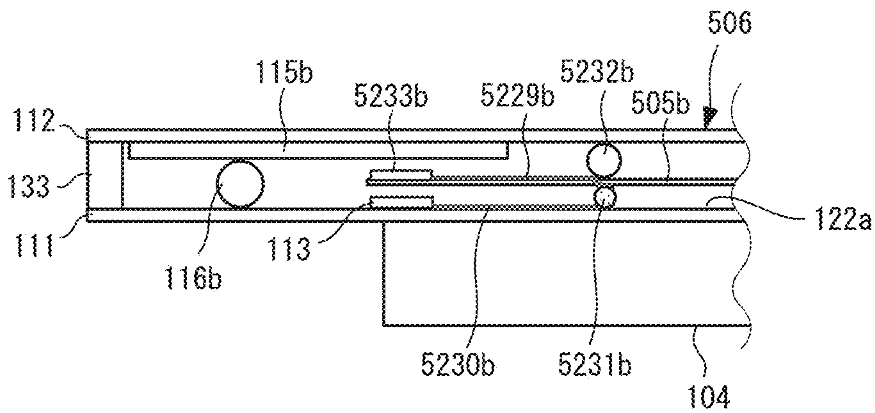
FIG. 24 is a cross-sectional view for description of configuration of another touch panel of Embodiment 5 of the present disclosure.

Further, electrical connection may be made between the first sheet 111 and the second sheet 112. Specifically, as illustrated in the cross-sectional view of FIG. 24, in the touch panel 506, structures 505*a* to 505*i* that include wires 5229*a* to 5229*i* and substrate-mounted contact points 5233*a* to 5233*i* are disposed between the first sheet 111 and the second sheet 112. These wires 5229*a* to 5229*i* are wires that electrically connect between the substrate-mounted contact points 5233*a* to 5233*i* and the paste stacked layers 5231*a* to 5231*i*. Further, the paste stacked layers 5231*a* to 5231*i* are formed from an electrically conductive material. Wires 5230*a* to 5230*i* are formed on the first main surface 122*a* of the first sheet 111 and connect together the first conductive path 113 and the paste stacked layers 5231*a* to 5231*i*. FIG. 24 illustrates the structure 505*b* as an example. That is, the substrate-mounted contact point 5233*b* formed on the structure 505*b* and the first conductive path 113 are connected together electrically via the wire 5229*b*, the paste stacked layer 5231*b*, and the wire 5230*b*. In the same manner, the substrate-mounted contact points 5233*a* and 5233*c* to 5233*i* formed on the structures 505*a* and 505*c* to 505*i* and the first conductive path 113 are connected together electrically via the wires 5229*a* and 5229*c* to 5229*i*, the paste stacked layers 5231*a* and 5231*c* to 5231*i*, and the wires 5230*a* and 5230*c* to 5230*i*.

In this case, when the user presses the position at which the structure 505*b* is disposed in the normal direction of the touch panel 506, the structure 505*b*, that is, the left side thereof as seen in the drawing, rises by pivoting around a fulcrum point of the paste stacked layer 5231*b* and the spacer 5232*b*, and the substrate-mounted contact point 5233*b* contacts the pressure-detecting conductive path 115*b*. That is, electrical contact is made between the first conductive path 113 and the pressure-detecting conductive path 115*b* associated with the pressed structure 505*b*.

Although FIG. 24 illustrates an example in which the paste stacked layer 5231*b* and the spacer 5232*b* are disposed within the image transmission regions 118 and 119 of the touch panel 506, these components may be disposed outside of the image transmission regions 118 and 119, that is, may be disposed within the surrounding areas 120 and 121. In this case, the wire 5229*a* and the wire 5230*b* are disposed within the surrounding area 120 and 121, and thus such configuration enables obtaining of visual unrecognizability of the wire 5229*a* and the wire 5230*b* for the user.

Figure 25:
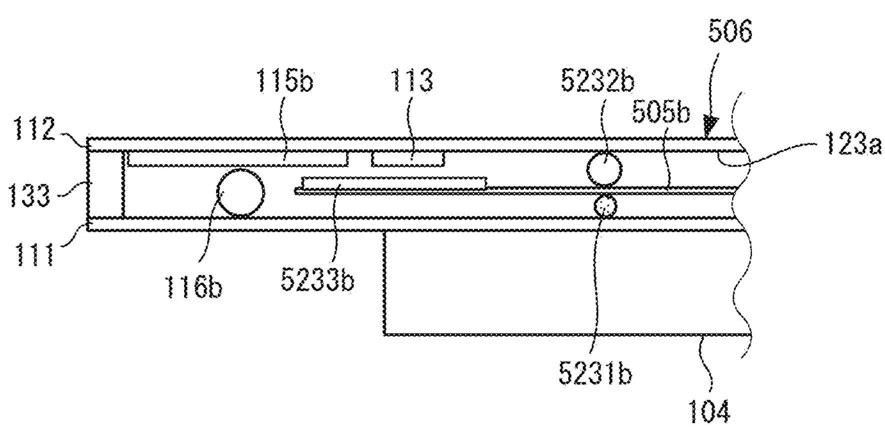
FIG. 25 is a cross-sectional view for description of configuration of yet another touch panel of Embodiment 5 of the present disclosure.
Figure 26:
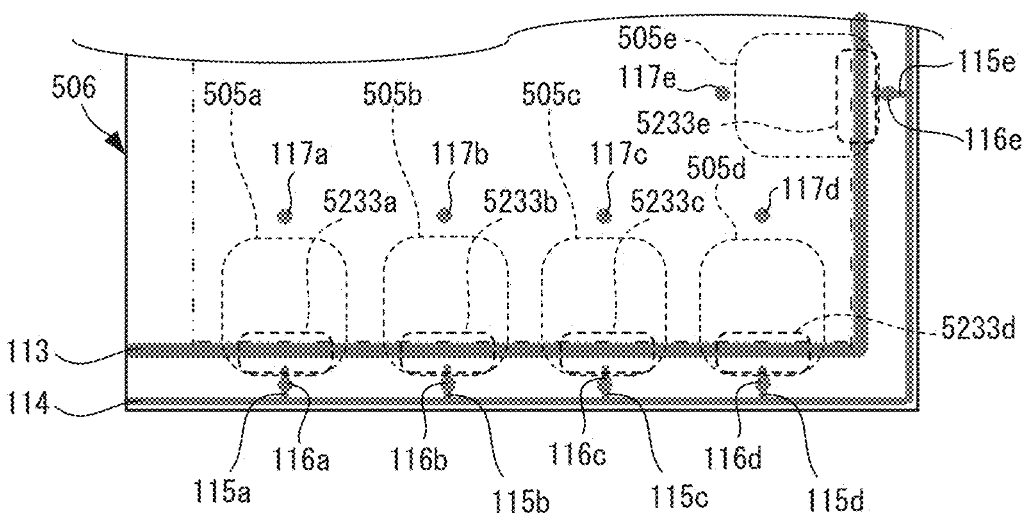
FIG. 26 is a front view for description of configuration of the yet another touch panel of Embodiment 5 of the present disclosure.

As illustrated in the cross-sectional view of FIG. 25 and the front view of FIG. 26, a configuration may be adopted in which the first conductive path 113 is formed on the second main surface 123*a* of the second sheet 112 of the touch panel 506, and the pressure-detecting conductive path 115*a* to 115*i* and the first conductive path 113 are made to contact each other electrically via the substrate-mounted contact points 5233*a* to 5233*i* formed on the structures 505*a* to 505*i*. FIG. 25 illustrates the structure 505*b* as an example.

Then when the user presses the position where the structure 505*b* is disposed in the normal direction of the touch panel 506, the structure 505*b*, that is, the left side as see in FIG. 25, rises by pivoting around the fulcrum point of the paste stacked layer 5231*b* and the spacer 5232*b*, and the substrate-mounted contact point 5233*b* contacts the pressure-detecting conductive path 115*b* and the first conductive path 113. That is, electrical contact is made between the first conductive path 113 and the pressure-detecting conductive path 115*b* associated with the pressed structure 505*b*. In this case, the wire 5229*b* and the wire 5230*b* as illustrated in FIG. 24, that is, the wires 5229*a* to 5229*i* and the wires 5230*a* to 5230*i*, become unnecessary, thereby enabling a further lowering of cost.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure can be used for a touch panel used for various types electrical equipment, devices, and the like.

REFERENCE SIGNS LIST

100 Remote controller
101 Communication
102 Air conditioner
103 Cover
104 Display
105*a* to 105*i*, 205*a* to 205*p*, 305*a* to 305*i*, 505*a* to 505*i* Structure
106, 206, 306, 406, 506 Touch panel
107 Power supply button
108 Power supply
109 Microcomputer
110 Opening
111 First sheet
112 Second sheet
113 First conductive path

114 Second conductive path
115*a* to 115*i* Pressure-detecting conductive path
116*a* to 116*i*, 117*a* to 117*i*, 216*a* to 216*p*, 217*a* to 217*p*, 5232*a* to 5232*i* Spacer
118, 119 Image transmission region
120, 121 Surrounding area
122*a* First main surface
123*a* Second main surface
122*b* Third main surface
123*b* Fourth main surface
124 A/D input port
125 Resistor
126 Control content data
127 Control content storage
128 Input signal controller
129 Device controller
130 Display controller
131 Input device
133 Adhesive
1210*a* to 1210*p* Minimum pressure-sensitive region
1220*a* to 1220*i* Tactile part
5229*a* to 5229*i*, 5230*a* to 5230*i* Wire
5231*a* to 5231*i* Paste stacked layer
5233*a* to 5233*i* Substrate-mounted contact point

The invention claimed is:

1. A touch panel comprising:

a first sheet;

a second sheet, the first sheet and the second sheet opposing each other with a gap therebetween;

a main conductive path formed on an inner surface of the second sheet;

a supplementary conductive path formed on the inner surface of the second sheet and spaced apart from the main conductive path as viewed in a normal direction of the first sheet; and a structure disposed between the first sheet and the second sheet and configured to form a contact point, the contact point overlapping the main conductive path and the supplementary conductive path as viewed in the normal direction, wherein the structure is supported by a supporting member in a state in which the contact point is not in contact with either the main conductive path or the supplementary conductive path, and upon downward pressing of an edge of the structure through the second sheet, the structure pivots using the supporting member as a fulcrum point to cause the contact point to contact the main conductive path and the supplementary conductive path.

2. The touch panel according to claim 1, wherein the structure is harder or stiffer than the second sheet.

* * * * *